(12) United States Patent
Lee et al.

(10) Patent No.: US 12,347,778 B2
(45) Date of Patent: Jul. 1, 2025

(54) SEMICONDUCTOR DEVICE AND ELECTRONIC SYSTEM INCLUDING THE SAME

(71) Applicant: Samsung Electronics Co., Ltd., Suwon-si (KR)

(72) Inventors: Kyunghwan Lee, Seoul (KR); Yongseok Kim, Suwon-si (KR); Dongsoo Woo, Seoul (KR); Junhee Lim, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 509 days.

(21) Appl. No.: 17/722,672

(22) Filed: Apr. 18, 2022

(65) Prior Publication Data

US 2023/0049653 A1     Feb. 16, 2023

(30) Foreign Application Priority Data

Aug. 13, 2021   (KR) .......................... 10-2021-0107335

(51) Int. Cl.
*H01L 23/535* (2006.01)
*H01L 23/00* (2006.01)
(Continued)

(52) U.S. Cl.
CPC ............ *H01L 23/535* (2013.01); *H01L 24/08* (2013.01); *H01L 25/0657* (2013.01);
(Continued)

(58) Field of Classification Search
CPC ........ H10B 20/00–10; H10B 20/27–50; H10B 20/20–25; H10B 69/00; H10B 41/00–70; H10B 43/00–50; H01L 2924/145; H01L 2924/1453; H01L 23/525–5258; H01L 2924/1451; H01L 25/03; H01L 25/04; H01L 25/065–0657; H01L 2225/06541–06544; G11C 17/10–126; G11C 17/14–165; G11C 16/02; G11C 16/0408–0458; G11C 16/0483;
(Continued)

(56) References Cited

U.S. PATENT DOCUMENTS 8,765,598 B2   7/2014  Smith et al.
9,343,452 B2   5/2016  Yun et al.
(Continued)

*Primary Examiner* — Amar Movva
*Assistant Examiner* — Eric Manuel Mulero Flores
(74) *Attorney, Agent, or Firm* — Harness, Dickey & Pierce, P.L.C.

(57) ABSTRACT

A semiconductor device including a substrate including a cell array region and a connection region, an electrode structure stacked on the substrate, each of the electrodes including a line portion on the cell array region and a pad portion on the connection region, Vertical patterns penetrating the electrode structure, a cell contact on the connection region and connected to the pad portion, an insulating pillar below the cell contact, with the pad portion interposed therebetween may be provided. The pad portion may include a first portion having a top surface higher than the line portion, and a second portion including a first protruding portion, the first protruding portion extending from the first portion toward the substrate and covering a top surface of the insulating pillar.

18 Claims, 37 Drawing Sheets

(51) Int. Cl.
   *H01L 25/065*     (2023.01)
   *H01L 25/18*     (2023.01)
   *H10B 41/27*     (2023.01)
   *H10B 43/27*     (2023.01)

(52) U.S. Cl.
   CPC ............ *H01L 25/18* (2013.01); *H10B 41/27* (2023.02); *H10B 43/27* (2023.02); *H01L 2224/08145* (2013.01); *H01L 2924/1431* (2013.01); *H01L 2924/14511* (2013.01)

(58) Field of Classification Search
   CPC .. G11C 11/5621–5642; G11C 11/5671; G11C 2216/06–10; G11C 16/0466–0475; G11C 27/005
   See application file for complete search history.

(56) References Cited

U.S. PATENT DOCUMENTS

| | | | |
|---|---|---|---|
| 10,504,914 B2 | 12/2019 | Wang | |
| 10,770,471 B2 | 9/2020 | Shimizu et al. | |
| 10,886,289 B2 | 1/2021 | Kang et al. | |
| 10,985,112 B2 | 4/2021 | Eom | |
| 10,991,717 B2 | 4/2021 | Baek | |
| 2013/0155800 A1* | 6/2013 | Shim | H01L 23/58 365/229 |
| 2015/0270165 A1* | 9/2015 | Hyun | H10B 43/35 257/329 |
| 2019/0148392 A1* | 5/2019 | Kanno | H10B 41/10 257/66 |
| 2019/0363014 A1* | 11/2019 | Lee | H01L 23/5226 |
| 2020/0350249 A1 | 11/2020 | Kim et al. | |
| 2021/0320094 A1* | 10/2021 | Zhang | H01L 24/08 |
| 2022/0254716 A1* | 8/2022 | Jang | H10B 43/27 |

\* cited by examiner

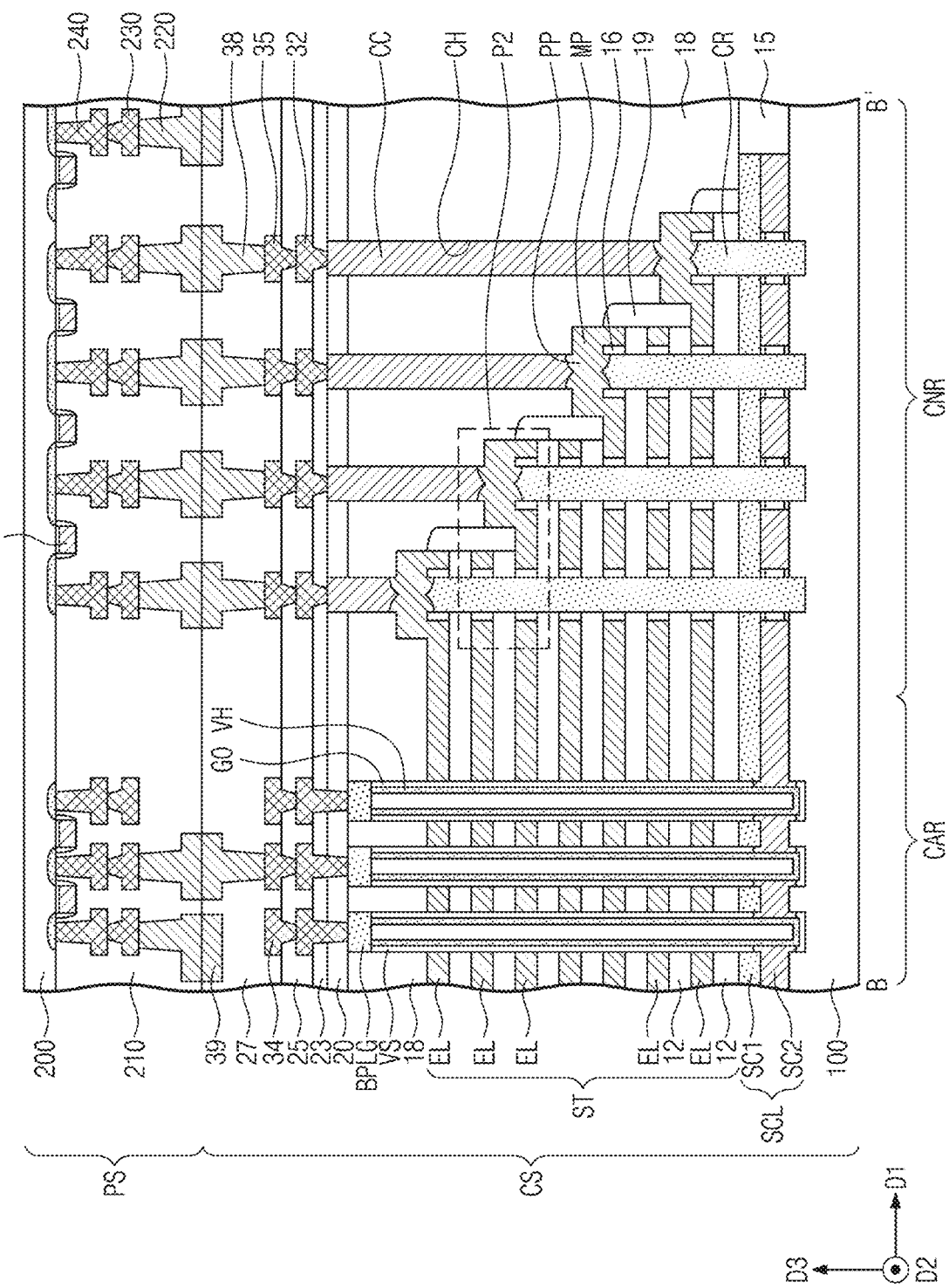

SEMICONDUCTOR DEVICE AND ELECTRONIC SYSTEM INCLUDING THE SAME

CROSS-REFERENCE TO RELATED APPLICATIONS

This U.S. non-provisional patent application claims priority under 35 U.S.C. § 119 to Korean Patent Application No. 10-2021-0107335, filed on Aug. 13, 2021, in the Korean Intellectual Property Office, the entire contents of which are hereby incorporated by reference.

BACKGROUND

The present disclosure relates to semiconductor devices and/or electronic systems including the same.

Higher integration of semiconductor devices is required to satisfy consumer demands for superior performance and inexpensive prices. In the case of semiconductor devices, since their integration is an important factor in determining product prices, increased integration is especially required. In the case of two-dimensional or planar semiconductor devices, since their integration is mainly determined by the area occupied by a unit memory cell, integration is greatly influenced by the level of a fine pattern forming technology. However, the extremely expensive process equipment needed to increase pattern fineness sets a practical limitation on increasing integration for two-dimensional or planar semiconductor devices. Thus, three-dimensional semiconductor memory devices including three-dimensionally arranged memory cells have been proposed.

SUMMARY

An example embodiment of the inventive concepts provides a semiconductor device, which is configured to have improved reliability and an increased integration density, and an electronic system including the same.

According to an example embodiment of the inventive concepts, a semiconductor device may include a substrate including a cell array region and a connection region, an electrode structure including electrodes stacked on the substrate, each of the electrodes including a line portion on the cell array region and a pad portion on the connection region, vertical patterns penetrating the electrode structure, a cell contact on the connection region and connected to the pad portion, and an insulating pillar below the cell contact, with the pad portion interposed therebetween. The pad portion may include a first portion having a top surface higher than the line portion, and a second portion including a first protruding portion extended from the first portion toward the substrate and covering a top surface of the insulating pillar.

According to an example embodiment of the inventive concepts, a semiconductor device may include a first chip including a substrate, the substrate including a cell array region and a connection region and a second chip including a peripheral circuit region and a second bonding metal layer. The first chip may include an electrode structure between the substrate and the second chip, the electrode structure including electrodes stacked on the substrate, each of the electrodes including a line portion on the cell array region and a pad portion on the connection region, vertical patterns penetrating the electrode structure, a cell contact on the connection region and connected to the pad portion, an insulating pillar below the cell contact, with the pad portion interposed therebetween, and a contact insulating pattern on a side surface of the insulating pillar, and a first bonding metal layer on the cell contact. The pad portion may include a first portion on a second portion and having a top surface higher than the line portion, the second portion between the cell contact and the insulating pillar, and the third portion connected to the line portion. The first bonding metal layer and the second bonding metal layer may be in direct contact with each other, at an interface between the first chip and the second chip A thickness of the second portion may be larger than a thickness of the first portion.

According to an example embodiment of the inventive concepts, an electronic system may include a main substrate, a semiconductor device on the main substrate, and a controller on the main substrate and electrically connected to the semiconductor device. The semiconductor device may include a substrate including a cell array region and a connection region, an electrode structure including electrodes stacked on the substrate, each of the electrodes including a line portion on the cell array region and a pad portion on the connection region, vertical patterns penetrating the electrode structure, a cell contact on the connection region and connected to the pad portion, and an insulating pillar below the cell contact, with the pad portion interposed therebetween. The pad portion may include a first portion having a top surface higher than the line portion, and a second portion including a first protruding portion, the first protruding portion extending from the first portion toward the substrate and covering a top surface of the insulating pillar.

BRIEF DESCRIPTION OF THE DRAWINGS

FIG. 7 is a sectional view taken along a line B-B' of FIG. 5.

DETAILED DESCRIPTION

Some example embodiments of the inventive concepts will now be described more fully with reference to the accompanying drawings, in which example embodiments are shown.

Figure 1:
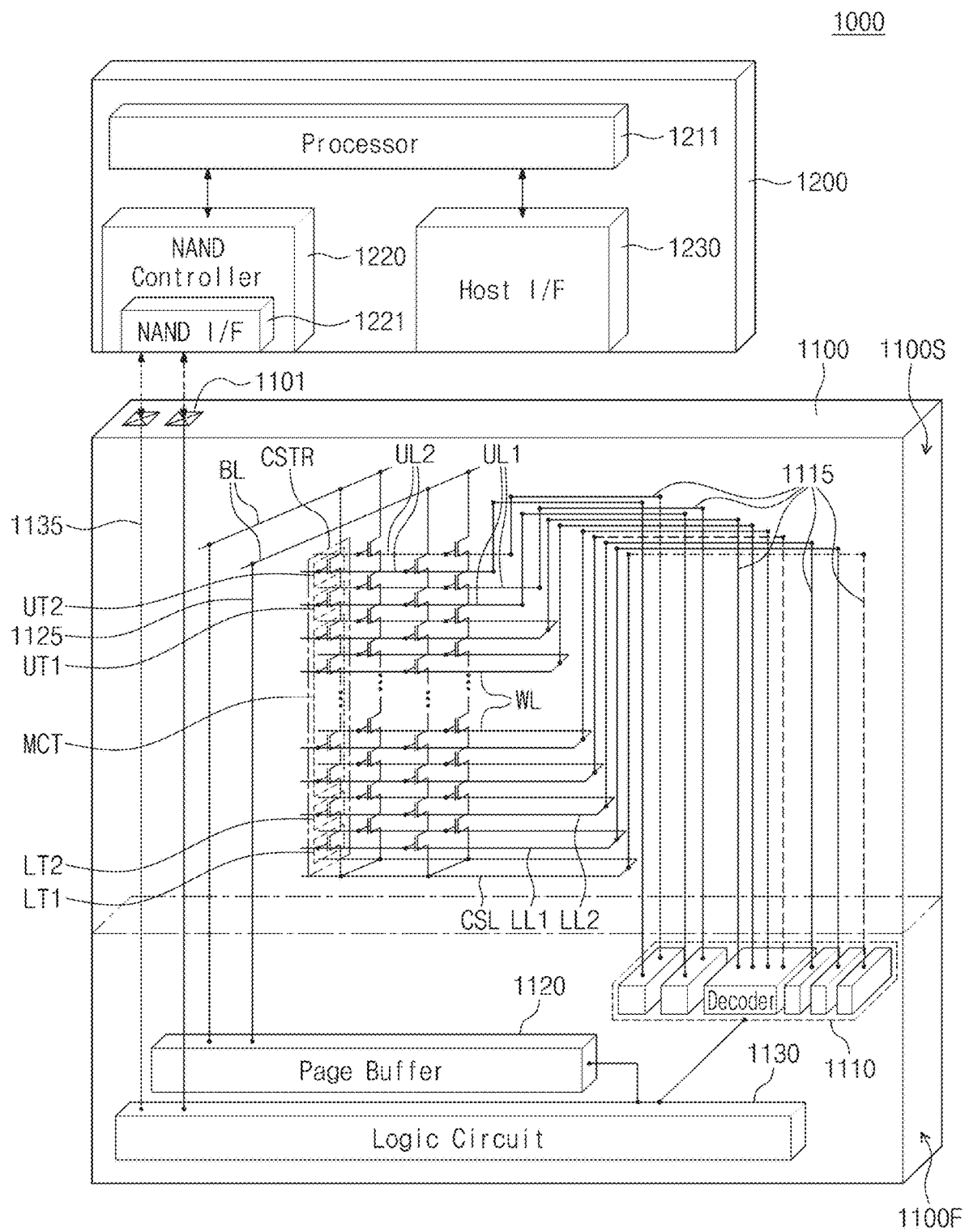
FIG. 1 is a diagram schematically illustrating an electronic system including a semiconductor device according to an example embodiment of the inventive concepts.

FIG. 1 is a diagram schematically illustrating an electronic system including a semiconductor device according to an example embodiment of the inventive concepts.

Referring to FIG. 1, an electronic system 1000 according to an example embodiment of the inventive concepts may include a semiconductor device 1100 and a controller 1200 electrically connected to the semiconductor device 1100. The electronic system 1000 may be a storage device, which includes one or more semiconductor devices 1100, or an electronic device including the storage device. For example, the electronic system 1000 may be a solid state drive (SSD) device, a universal serial bus (USB), a computing system, a medical system, or a communication system, in which at least one semiconductor device 1100 is provided.

The semiconductor device 1100 may be a nonvolatile memory device (e.g., a NAND FLASH memory device). The semiconductor device 1100 may include a first structure 1100F and a second structure 1100S on the first structure 1100F. In an example embodiment, the first structure 1100F may be disposed to be adjacent to the second structure 1100S in a horizontal direction. The first structure 1100F may be a peripheral circuit structure including a decoder circuit 1110, a page buffer 1120, and a logic circuit 1130. The second structure 1100S may be a memory cell structure including a bit line BL, a common source line CSL, word lines WL, first and second gate upper lines UL1 and UL2, first and second gate lower lines LL1 and LL2, and memory cell strings CSTR between the bit line BL and the common source line CSL.

In the second structure 1100S, each of the memory cell strings CSTR may include lower transistors LT1 and LT2 adjacent to the common source line CSL, upper transistors UT1 and UT2 adjacent to the bit line BL, and a plurality of memory cell transistors MCT disposed between the lower transistors LT1 and LT2 and the upper transistors UT1 and UT2. The number of the lower transistors LT1 and LT2 and the number of the upper transistors UT1 and UT2 may be variously changed, according to some example embodiments.

In an example embodiment, at least one of the upper transistors UT1 and UT2 may include a string selection transistor, and at least one of the lower transistors LT1 and LT2 may include a ground selection transistor. The gate lower lines LL1 and LL2 may be used as gate electrodes of the lower transistors LT1 and LT2, respectively. The word lines WL may be used as gate electrodes of the memory cell transistors MCT, and the gate upper lines UL1 and UL2 may be used as gate electrodes of the upper transistors UT1 and UT2, respectively.

In an example embodiment, the lower transistors LT1 and LT2 may include a lower erase control transistor LT1 and a ground selection transistor LT2, which are connected in series. The upper transistors UT1 and UT2 may include a string selection transistor UT1 and an upper erase control transistor UT2, which are connected in series. At least one of the lower and upper erase control transistors LT1 and UT2 may be used for an erase operation of erasing data, which are stored in the memory cell transistors MCT, using a gate-induced drain leakage (GIDL) phenomenon.

The common source line CSL, the first and second gate lower lines LL1 and LL2, the word lines WL, and the first and second gate upper lines UL1 and UL2 may be electrically connected to the decoder circuit 1110 through first connection lines 1115, which are extended from the first structure 1100F to the second structure 1100S. The bit lines BL may be electrically connected to the page buffer 1120 through second connection lines 1125, which are extended from the first structure 1100F to the second structure 1100S.

In the first structure 1100F, the decoder circuit 1110 and the page buffer 1120 may be configured to perform a control operation on at least selected one of the memory cell transistors MCT. The decoder circuit 1110 and the page buffer 1120 may be controlled by the logic circuit 1130. The semiconductor device 1100 may communicate with the controller 1200 through an input/output pad 1101, which is electrically connected to the logic circuit 1130. The input/output pad 1101 may be electrically connected to the logic circuit 1130 through an input/output connection line 1135, which is extended from the first structure 1100F to the second structure 1100S.

The controller 1200 may include a processor 1211, a NAND controller 1220, and a host interface 1230. In an example embodiment, the electronic system 1000 may include a plurality of semiconductor devices 1100, which are controlled by the controller 1200.

The processor 1211 may be configured to control overall operations of the electronic system 1000 including the controller 1200. The processor 1211 may be operated depending on a specific firmware and may control the NAND controller 1220 to access the semiconductor device 1100. The NAND controller 1220 may include a NAND interface 1221 which is used for communication with the semiconductor device 1100. The NAND interface 1221 may be used to transmit control commands, which are used to control the semiconductor device 1100, and data, which will be written in or read from the memory cell transistors MCT of the semiconductor device 1100. The host interface 1230 may be configured to allow for communication between the electronic system 1000 and an external host. When the control command is received from the external host through the host interface 1230, the processor 1211 may control the semiconductor device 1100 in response to the control command FIG. 2 is a perspective view schematically illustrating an electronic system including a semiconductor device, according to an example embodiment of the inventive concepts.

Figure 2:
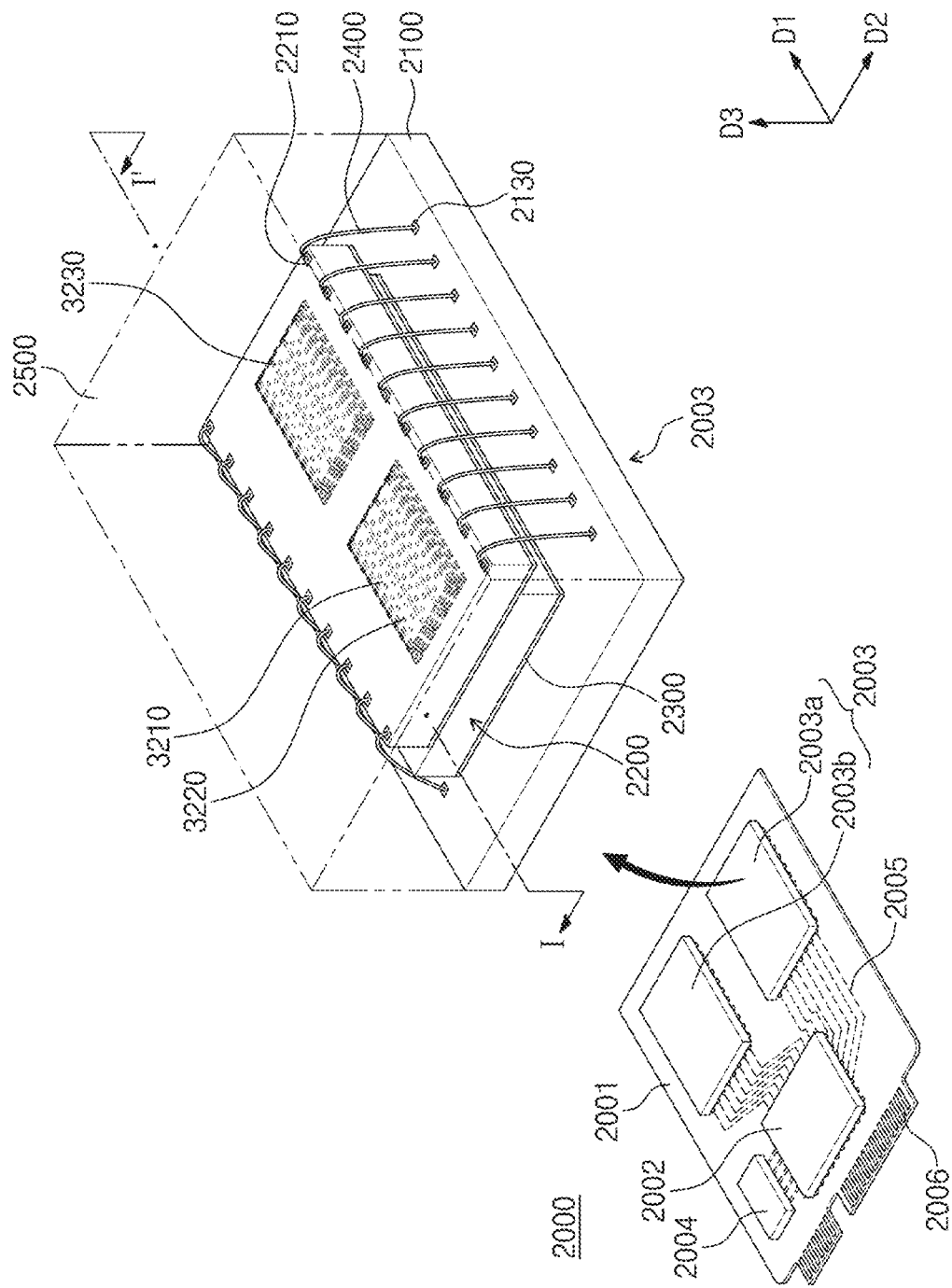
FIG. 2 is a perspective view schematically illustrating an electronic system including a semiconductor device, according to an example embodiment of the inventive concepts.

Referring to FIG. 2, an electronic system 2000 according to an example embodiment of the inventive concepts may include a main substrate 2001 and a controller 2002, at least one semiconductor package 2003, and a DRAM 2004, which are mounted on the main substrate 2001. The semiconductor package 2003 and the DRAM 2004 may be connected to the controller 2002 by interconnection patterns 2005, which are formed in the main substrate 2001.

The main substrate 2001 may include a connector 2006, which includes a plurality of pins coupled to an external host. In the connector 2006, the number and arrangement of the pins may be changed depending on a communication interface between the electronic system 2000 and the external host. In an example embodiment, the electronic system 2000 may communicate with the external host, in accordance with one of interfaces, such as universal serial bus (USB), peripheral component interconnect express (PCI-Express), serial advanced technology attachment (SATA), universal flash storage (UFS) M-Phy, or the like. In an example embodiment, the electronic system 2000 may be driven by an electric power, which is supplied from the external host through the connector 2006. The electronic system 2000 may further include a power management integrated circuit (PMIC) that is configured to separately supply an electric power, which is provided from the external host, to the controller 2002 and the semiconductor package 2003.

The controller 2002 may be configured to control a writing or reading operation on the semiconductor package 2003 and to improve an operation speed of the electronic system 2000.

The DRAM 2004 may be a buffer memory that is configured to relieve technical difficulties caused by a difference in speed between the semiconductor package 2003, which serves as a data storage device, and an external host. In an example embodiment, the DRAM 2004 in the electronic system 2000 may serve as a cache memory and may be used as a storage space, which is used to temporarily store data during a control operation on the semiconductor package 2003. In the case where the electronic system 2000 includes the DRAM 2004, the controller 2002 may further include a DRAM controller for controlling the DRAM 2004, in addition to a NAND controller for controlling the semiconductor package 2003.

The semiconductor package 2003 may include first and second semiconductor packages 2003a and 2003b, which are spaced apart from each other. Each of the first and second semiconductor packages 2003a and 2003b may be a semiconductor package including a plurality of semiconductor chips 2200. Each of the first and second semiconductor packages 2003a and 2003b may include a package substrate 2100, the semiconductor chips 2200 on the package substrate 2100, adhesive layers 2300 disposed on respective bottom surfaces of the semiconductor chips 2200, a connection structure 2400 electrically connecting the semiconductor chips 2200 to the package substrate 2100, and a molding layer 2500 disposed on the package substrate 2100 to cover the semiconductor chips 2200 and the connection structure 2400.

The package substrate 2100 may be a printed circuit board including package upper pads 2130. Each of the semiconductor chips 2200 may include an input/output pad 2210. The input/output pad 2210 may correspond to the input/output pad 1101 of FIG. 1. Each of the semiconductor chips 2200 may include gate stacks 3210 and vertical patterns 3220. Each of the semiconductor chips 2200 may include a semiconductor device according to an example embodiment of the inventive concepts, which will be described below.

In an example embodiment, the connection structure 2400 may be a bonding wire electrically connecting the input/output pad 2210 to the package upper pad 2130. Thus, in each of the first and second semiconductor packages 2003a and 2003b, the semiconductor chips 2200 may be electrically connected to each other in a bonding wire manner and may be electrically connected to the package upper pads 2130 of the package substrate 2100. In an example embodiment, the semiconductor chips 2200 in each of the first and second semiconductor packages 2003a and 2003b may be electrically connected to each other by a connection structure including through silicon vias (TSVs), not by the connection structure 2400 provided in the form of bonding wires.

In an example embodiment, the controller 2002 and the semiconductor chips 2200 may be included in a single package. In an example embodiment, the controller 2002 and the semiconductor chips 2200 may be mounted on a separate interposer substrate, which is prepared independent of the main substrate 2001, and may be connected to each other through interconnection lines, which are provided in the interposer substrate.

Figure 3:
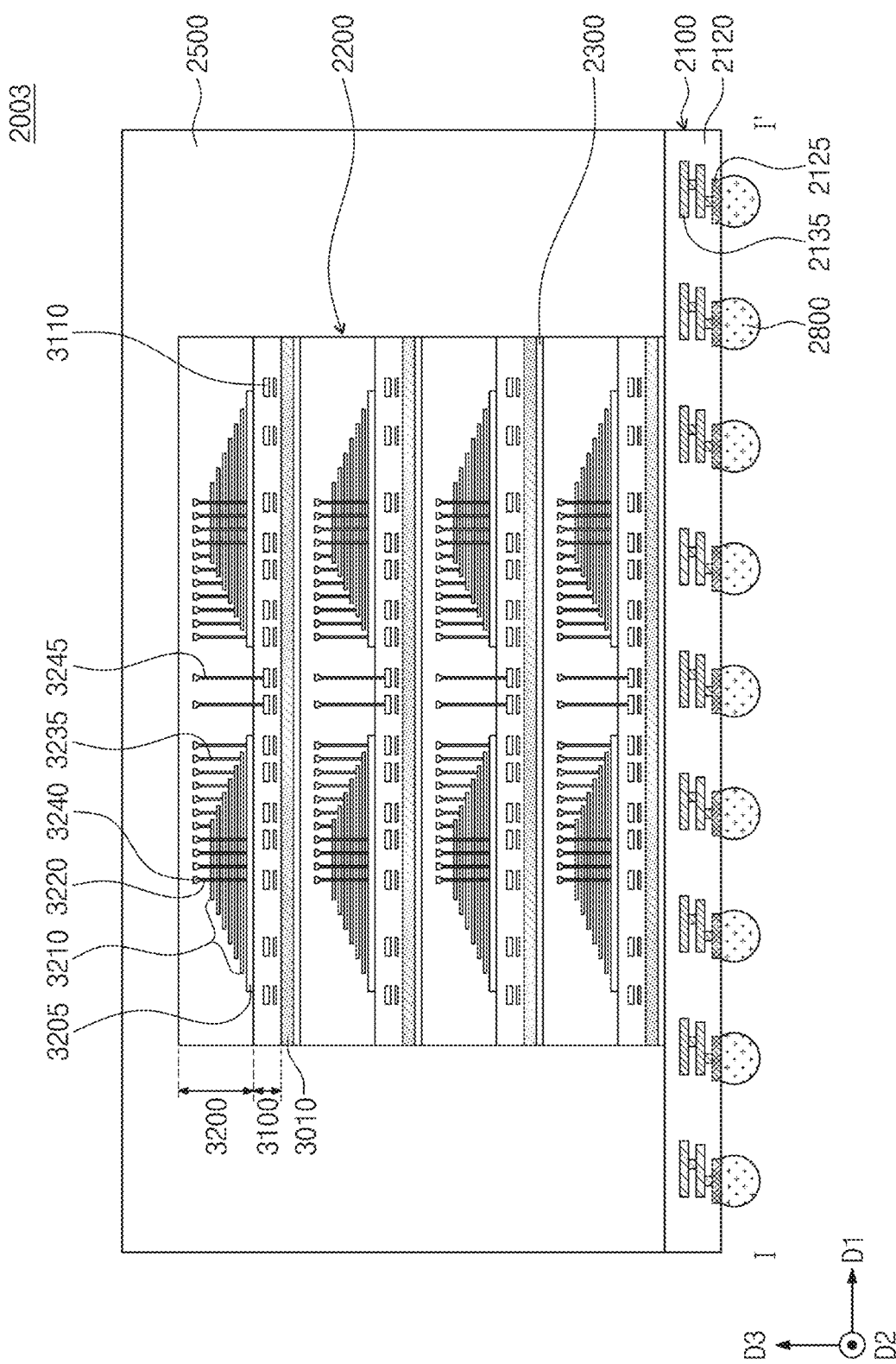
FIGS. 3 and 4 are sectional views, each of which schematically illustrates a semiconductor package according to an example embodiment of the inventive concepts.
Figure 4:
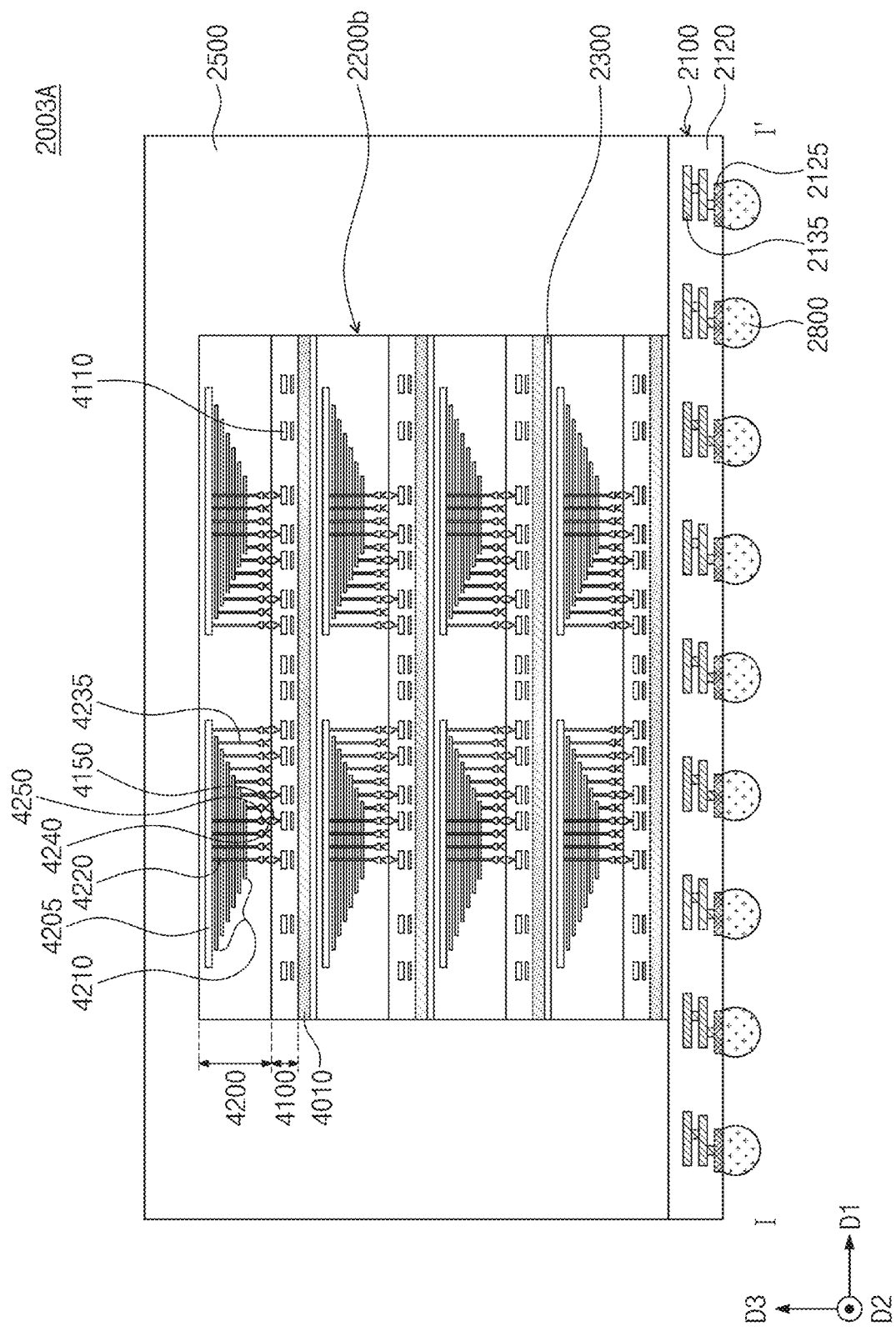

FIGS. 3 and 4 are sectional views, each of which schematically illustrates a semiconductor package according to an example embodiment of the inventive concepts. FIGS. 3 and 4 conceptually illustrate two different examples of the semiconductor package of FIG. 2 and are, for example, sectional views taken along a line I-I' of FIG. 2.

Referring to FIG. 3, in the semiconductor package 2003, the package substrate 2100 may be a printed circuit board. The package substrate 2100 may include a package substrate body portion 2120, the package upper pads 2130 (e.g., of FIG. 2) disposed on a top surface of the package substrate body portion 2120, lower pads 2125, which are disposed on or exposed through a bottom surface of the package substrate body portion 2120, and internal lines 2135, which are provided in the package substrate body portion 2120 to electrically connect the upper pads 2130 to the lower pads 2125. The upper pads 2130 may be electrically connected to the connection structures 2400. The lower pads 2125 may be connected to the interconnection patterns 2005, which are provided in the main substrate 2001 of the electronic system 2000, through conductive connecting portions 2800, as shown in FIG. 2.

Each of the semiconductor chips 2200 may include a semiconductor substrate 3010 and first and second structures 3100 and 3200, which are sequentially stacked on the semiconductor substrate 3010. The first structure 3100 may include a peripheral circuit region, in which peripheral lines 3110 are provided. The second structure 3200 may include a source structure 3205, the stack 3210 on the source structure 3205, the vertical patterns 3220 and separation structures 3230 (e.g., see FIG. 2) penetrating the stack 3210, bit lines 3240 electrically connected to the vertical patterns 3220, and cell contact plugs 3235 electrically connected to the word lines WL (e.g., of FIG. 1) of the stack 3210. Each of the first and second structures 3100 and 3200 and the semiconductor chips 2200 may further include separation structures to be described below.

Each of the semiconductor chips 2200 may include penetration lines 3245, which are electrically connected to the peripheral lines 3110 of the first structure 3100 and are extended into the second structure 3200. The penetration line 3245 may be disposed outside the stack 3210 or may be disposed to penetrate the stack 3210. Each of the semiconductor chips 2200 may further include the input/output pads 2210 (e.g., of FIG. 2), which are electrically connected to the peripheral lines 3110 of the first structure 3100.

Referring to FIG. 4, in a semiconductor package 2003A, each of semiconductor chips 2200b may include a semiconductor substrate 4010, a first structure 4100 on the semiconductor substrate 4010, and a second structure 4200, which is provided on the first structure 4100 and is bonded with the first structure 4100 in a wafer bonding manner The first structure 4100 may include a peripheral circuit region, in which a peripheral line 4110 and first junction structures 4150 are provided. The second structure 4200 may include a source structure 4205, a stack 4210 between the first structure 4100 and the source structure 4205, vertical patterns 4220 and a separation structure penetrating the stack 4210, and second junction structures 4250, which are electrically and respectively connected to the vertical patterns 4220 and the word lines WL (e.g., see FIG. 1) of the stack 4210. For example, the second junction structures 4250 may be electrically connected to the vertical patterns 4220 and the word lines WL (e.g., see FIG. 1A), respectively, through bit lines 4240 and cell contact plugs 4235, which are electrically connected to the vertical patterns 4220 and the word lines WL (e.g., see FIG. 1A), respectively. The first junction structures 4150 of the first structure 4100 may be in contact with and bonded to the second junction structures 4250 of the second structure 4200. The bonded portions of the first and second junction structures 4150 and 4250 may be formed of or include, for example, copper (Cu). Each of the semiconductor chips 2200b may include the input/output pad 2210 (e.g., see FIG. 2), which are electrically connected to the peripheral lines 4110 of the first structure 4100.

The semiconductor chips 2200 of FIG. 3 and the semiconductor chips 2200b of FIG. 4 may be electrically connected to each other by the connection structures 2400, which are provided in the form of bonding wires. However, in an example embodiment, a plurality of semiconductor chips (e.g., 2200 or 2200b in FIG. 3 or 4), which are provided in a single semiconductor package, may be electrically connected to each other by a connection structure (e.g., through-silicon vias (TSVs)).

The first structure 3100 of FIG. 3 and the first structure 4100 of FIG. 4 may correspond to a peripheral circuit structure in an example embodiment to be described below, and the second structure 3200 of FIG. 3 and the second structure 4200 of FIG. 4 may correspond to a cell array structure in an example embodiment to be described below.

Figure 5:
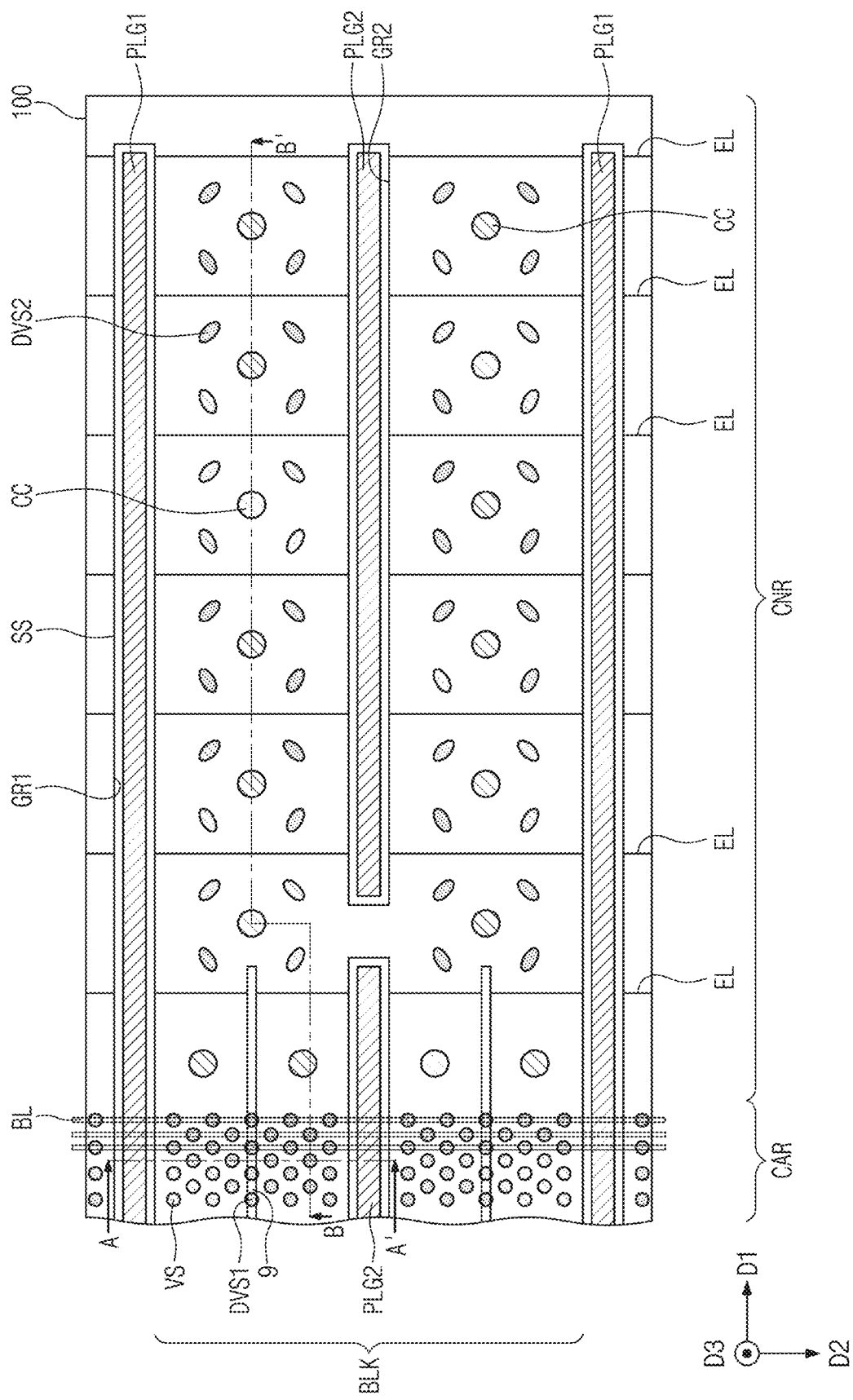
FIG. 5 is a plan view illustrating a semiconductor device according to an example embodiment of the inventive concepts.
Figure 6:
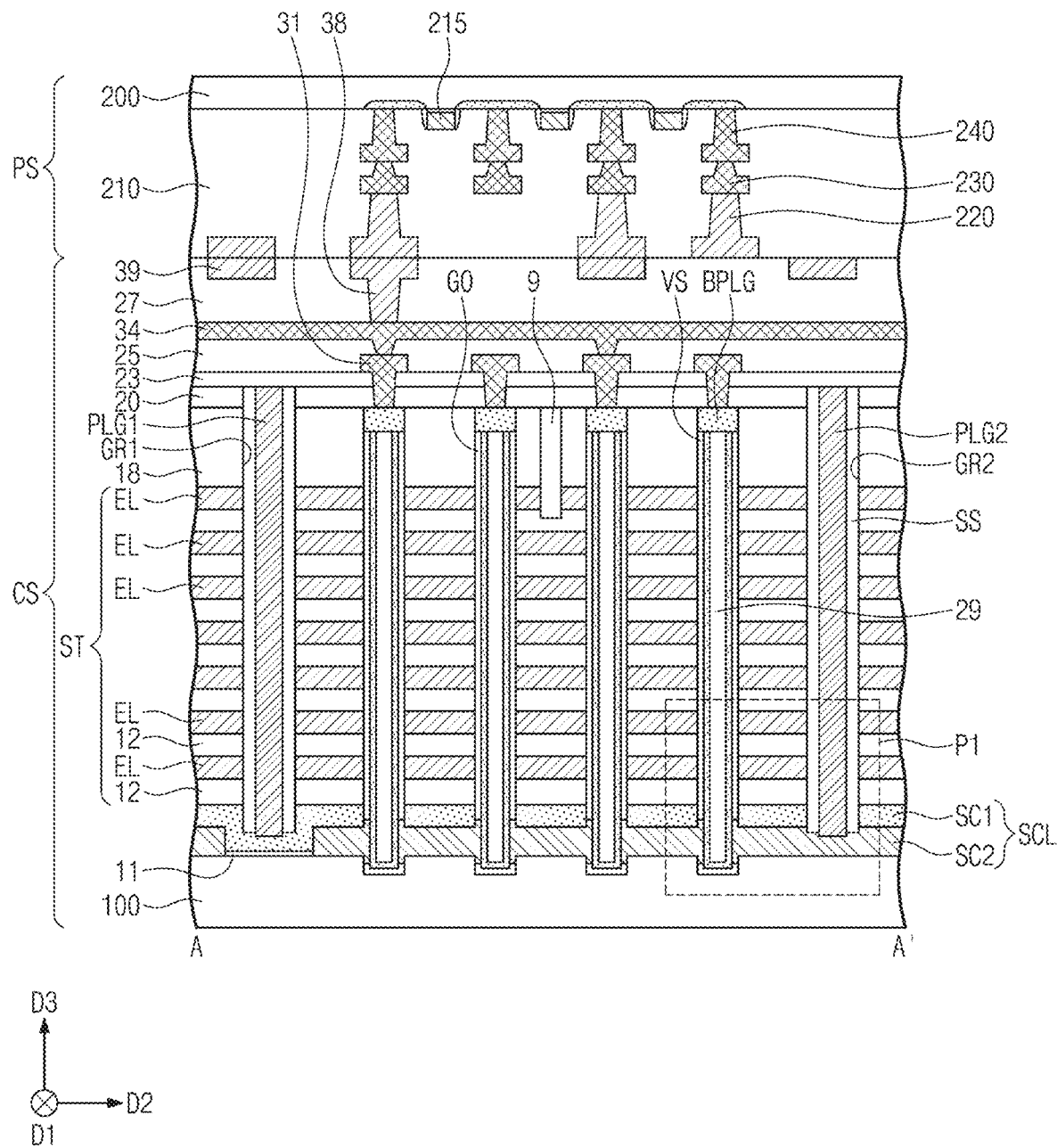
FIG. 6 is a sectional view taken along a line A-A' of FIG. 5.
Figure 8A:
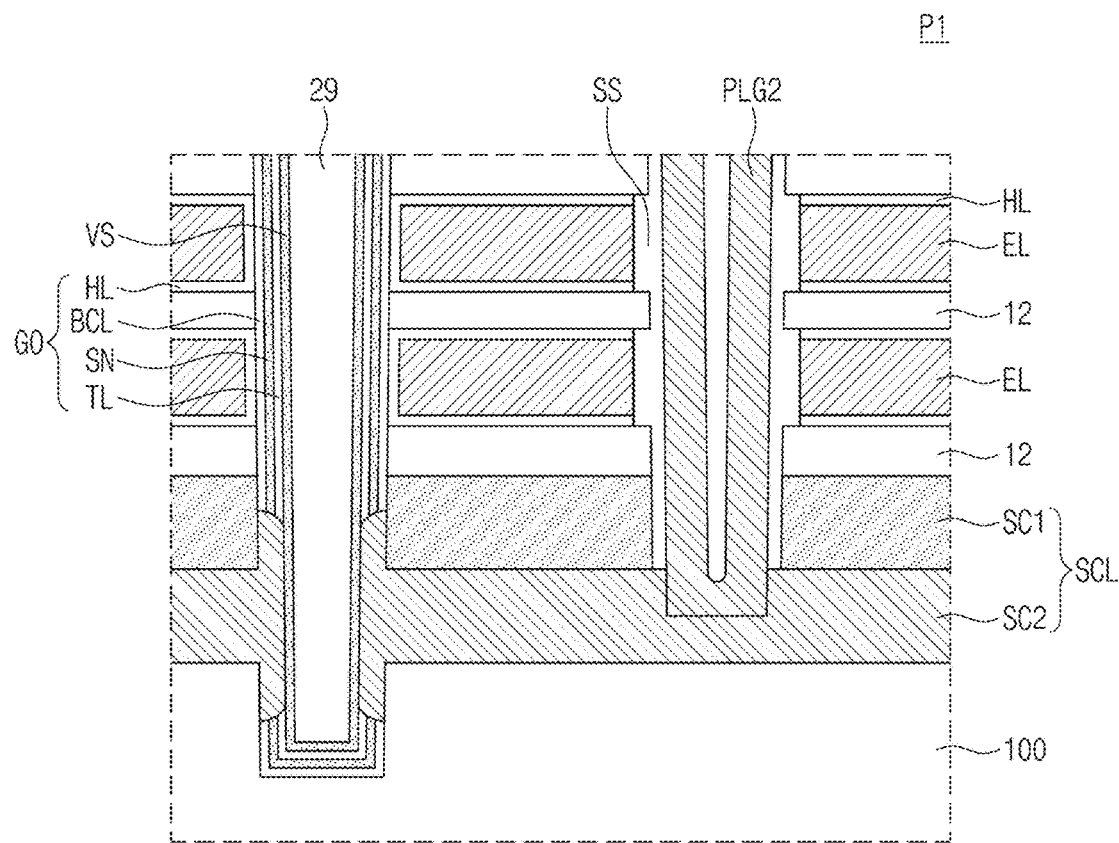
FIG. 8A is an enlarged sectional view of a portion 'P1' of FIG. 6.
Figure 8B:
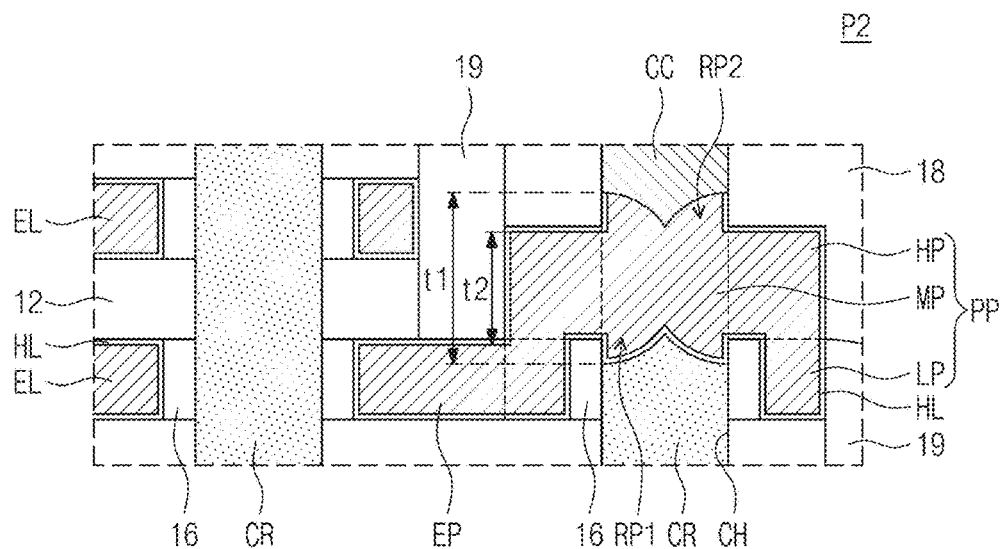
FIG. 8B is an enlarged sectional view of a portion 'P2' of FIG. 7.

FIG. 5 is a plan view illustrating a semiconductor device according to an example embodiment of the inventive concepts. FIG. 6 is a sectional view taken along a line A-A' of FIG. 5. FIG. 7 is a sectional view taken along a line B-B' of FIG. 5. FIG. 8A is an enlarged sectional view of a portion 'P1' of FIG. 6. FIG. 8B is an enlarged sectional view of a portion 'P2' of FIG. 7.

Referring to FIGS. 5, 6, 7, 8A, and 8B, a semiconductor device including a first chip CS and a second chip PS, which are connected to each other, may be provided.

The first chip CS may include a first substrate 100. The first substrate 100 may be a single-crystalline silicon substrate. The first substrate 100 may include a cell array region CAR and a connection region CNR. The connection region CNR is illustrated to be provided at a side of the cell array region CAR but in an example embodiment, it may be provided at an opposite side of the cell array region CAR. The first chip CS may include a plurality of memory blocks BLK, and the plan view of FIG. 5 illustrates one of the memory blocks BLK. First source contact plugs PLG1 may be disposed between adjacent ones of the memory blocks BLK. Further, a second source contact plug PLG2 may be disposed in each memory block BLK. There may be a discontinuous or cutting region, which is formed on the connection region CNR, to separate the second source contact plugs PLG2 from each other. An insulating spacer SS may be disposed between the first and second source contact plugs PLG1 and PLG2 and an electrode structure to be described below. The first and second source contact plugs PLG1 and PLG2 may be formed of or include at least one of, for example, doped semiconductor materials (e.g., doped silicon and so forth), metallic materials (e.g., tungsten, copper, aluminum, and so forth), conductive metal nitrides (e.g., titanium nitride, tantalum nitride, and so forth), or transition metals (e.g., titanium, tantalum, and so forth).

The first chip CS may include a source structure SCL and an electrode structure ST, which are sequentially stacked on the first substrate 100. A substrate insulating pattern 15 may be provided on the connection region CNR to penetrate the source structure SCL. The substrate insulating pattern 15 may be formed of or include at least one of silicon oxide, silicon nitride, or silicon oxynitride.

The electrode structure ST may include electrodes EL and electrode interlayer insulating layers 12, which are alternately stacked. The source structure SCL may include a first source pattern SC1 and a second source pattern SC2 thereunder. The second source pattern SC2 may be interposed between the first source pattern SC1 and the first substrate 100. A portion of the first source pattern SC1 may penetrate the second source pattern SC2. A buffer insulating layer 11 may be interposed between the portion of the first source pattern SC1 and the first substrate 100. Each of the first and second source patterns SC1 and SC2 may be formed of or include a single- or poly-crystalline doped silicon material that is of an n- or p-type. A conductivity type of the second source pattern SC2 may be the same as that of the first source pattern SC1. A doping concentration of the second source pattern SC2 may be equal to or higher than that of the first source pattern SC1. The source structure SCL may serve as the common source line CSL of FIG. 1. The buffer insulating layer 11 and the electrode interlayer insulating layers 12 may be formed of or include, for example, silicon oxide. The electrodes EL may be formed of or include at least one of, for example, metallic materials (e.g., tungsten).

The electrode structure ST may be covered with a planarization insulating layer 18. Upper insulating layers 20, 23, 25, and 27 may be provided on the planarization insulating layer 18. The planarization insulating layer 18 and the upper insulating layers 20, 23, 25, and 27 may be formed of or include the same insulating material (e.g., silicon oxide) as the electrode interlayer insulating layers 12. A first groove GR1 and a second groove GR2, which are spaced apart from each other, may penetrate a first upper insulating layer 20, the planarization insulating layer 18, and the electrode structure ST. The first source contact plug PLG1 and the insulating spacer SS may be disposed in the first groove GR1, and the second source contact plug PLG2 and the insulating spacer SS may be disposed in the second groove GR2. The first source contact plug PLG1 may be in contact with the first source pattern SC1. The second source contact plug PLG2 may be in contact with the second source pattern SC2.

In an example embodiment, the semiconductor device may be a vertical-type NAND FLASH memory device. The uppermost one of the electrodes EL may be divided into a plurality of line patterns, which are extended in a first direction D1, by an insulating separation pattern 9 and may serve as the gate upper lines UL1 and UL2 of FIG. 1. The lowermost ones of the electrodes EL may serve as the gate lower lines LL1 and LL2 of FIG. 1. The remaining ones of the electrodes EL may serve as the word lines WL of FIG. 1.

A plurality of cell vertical patterns VS may be provided on the cell array region CAR to penetrate the planarization insulating layer 18, the electrode structure ST, and the source structure SCL. As shown in FIG. 5, first dummy vertical patterns DVS1 may be disposed on the cell array region CAR and between the cell vertical patterns VS. The first dummy vertical patterns DVS1 may be arranged in the first direction D1 to form a single column. The insulating separation patterns 9 may be disposed between upper portions of the first dummy vertical patterns DVS1. The insulating separation patterns 9 may be formed of or include the same insulating material (e.g., silicon oxide) as the electrode interlayer insulating layers 12.

As shown in FIG. 5, a plurality of second dummy vertical patterns DVS2 may be provided on the connection region CNR. The second dummy vertical patterns DVS2 may penetrate the planarization insulating layer 18, the electrode structure ST, and the source structure SCL. The second dummy vertical patterns DVS2 may have a width larger than those of the cell vertical patterns VS and the first dummy vertical patterns DVS1. The second dummy vertical patterns DVS2 may have an elliptical shape, when viewed in a plan view.

The vertical patterns VS, DVS1, and DVS2 may include a doped or undoped silicon layer having a single- or polycrystalline structure. An inner region of each of the vertical patterns VS, DVS1, and DVS2 may be filed with an insulating gap-fill pattern 29 (e.g., see FIG. 8A). The insulating gap-fill pattern 29 may have a single or multi-layered structure including at least one of, for example, a silicon oxide layer, a silicon nitride layer, or a silicon oxynitride layer. A bit line pad BPLG may be disposed on each of the vertical patterns VS, DVS1, and DVS2. The bit line pad BPLG may be formed of or include at least one of doped polysilicon or metallic materials (e.g., tungsten, aluminum, or copper).

A gate insulating layer GO may be interposed between the vertical patterns VS, DVS1, and DVS2 and the electrode structure ST. The second source pattern SC2 may penetrate the gate insulating layer GO and may be in contact with lower side surfaces of the cell vertical patterns VS, respectively.

Referring to FIG. 8A, the gate insulating layer GO may include a tunnel insulating layer TL, a charge storing layer SN, and a blocking insulating layer BCL. The charge storing layer SN may be a trap insulating layer, a floating gate electrode, or an insulating layer including conductive nanodots. For example, the charge storing layer SN may include at least one of a silicon nitride layer, a silicon oxynitride layer, a silicon-rich nitride layer, a nanocrystalline silicon layer, or a laminated trap layer. The tunnel insulating layer TL may be one of materials having a higher band gap than the charge storing layer SN, and the blocking insulating layer BCL may be a high-k dielectric layer (e.g., an aluminum oxide layer or a hafnium oxide layer).

The gate insulating layer GO may further include a horizontal insulating layer HL. The horizontal insulating layer HL may be interposed between the blocking insulating layer BCL and the electrodes EL. The horizontal insulating layer HL may extend into regions between the electrodes EL and the electrode interlayer insulating layers 12. The horizontal insulating layer HL may have a higher dielectric constant than the silicon oxide layer and may include a metal oxide layer (e.g., a hafnium oxide layer or an aluminum oxide layer). The gate insulating layer GO may be divided into two portions, which are vertically separated from each other, by the second source pattern SC2. The insulating spacer SS may include protruding portions, which laterally extend toward the electrode EL, and each of which is interposed between adjacent ones of the electrode interlayer insulating layers 12.

Hereinafter, pad portions PP of the electrodes EL and a neighboring structure adjacent thereto will be described in more detail with reference to FIGS. 7 and 8B.

Each of the electrodes EL may include a line portion EP on the cell array region CAR and the pad portion PP on the connection region CNR. The line portion EP may extend from the cell array region CAR to the connection region CNR and may be connected to the pad portion PP. The line portion EP of each of the electrodes EL may have a same or substantially similar thickness.

The electrodes EL may have end portions that are arranged to form a stepwise structure on the connection region CNR. In other words, the end portions of the electrodes EL may be offset from each other such that each of them is not veiled by another electrode thereon and is connected to a cell contact to be described below. FIG. 7 illustrates an example in which odd-numbered ones of the electrodes have the exposed end portions and even-numbered ones of the electrodes do not have the exposed end portions, but in an example embodiment, each step of the stepwise structure may be composed of three or more electrodes. Although not illustrated in FIG. 7 taken along the line B-B' of FIG. 5, the electrodes may have end portions, which are exposed to be in contact with the cell contacts in a region which is not illustrated in the sectional view of FIG. 7 taken along the B-B' section of FIG. 5 (e.g., a region spaced apart from the exposed end portions in a second direction D2 or a region located near an opposite side of the cell array region CAR). Hereinafter, the end portion of the electrode EL connected to the cell contact will be referred to as the pad portion PP.

Pad insulating patterns 19 may be provided between adjacent ones of the pad portions PP. The pad insulating patterns 19 may fill a space between side surfaces of the pad portions PP. In an example embodiment, the pad insulating patterns 19 may be formed of or include silicon oxide.

A top surface of the pad portion PP may be connected to a corresponding one of cell contacts CC, which penetrate the planarization insulating layer 18. An insulating pillar CR may be provided below each of the pad portions PP. Each of the insulating pillars CR may be aligned to a corresponding one of the cell contacts CC. In other words, the insulating pillar CR may fill a lower portion of a penetration hole CH, and the cell contact CC may fill an upper portion of the penetration hole CH. The pad portion PP may be provided between the insulating pillar CR and the cell contact CC. The insulating pillar CR may be formed of or include at least one of silicon nitride or silicon oxynitride. Each of the insulating pillars CR may penetrate the electrodes EL placed therebelow and may be connected to an upper portion of the first substrate 100. A top surface of the insulating pillar CR may be higher than a bottom surface of the line portion EP of the electrode EL connected thereto.

The cell contacts CC may be formed of or include at least one of metallic materials (e.g., tungsten, copper, and aluminum). Each of the cell contacts CC may include a diffusion barrier layer provided on its surface. In an example embodiment, the diffusion barrier layer may include at least one of a titanium layer, a titanium nitride layer, a tantalum layer, or a tantalum nitride layer.

Contact insulating patterns 16 may be disposed between each of the insulating pillars CR and the electrodes EL. The contact insulating patterns 16, which are provided on each of the insulating pillars CR, may be arranged in a third direction D3. The contact insulating patterns 16 may be formed of or include at least one of silicon oxide or silicon oxynitride.

The pad portion PP may include a first portion HP having a top surface higher than the line portion EP. The pad portion PP may further include a second portion MP including a first protruding portion RP1, which extends from the first portion HP toward the first substrate 100. The pad portion PP may further include a third portion LP, which is provided below the first portion HP and at the same level as the line portion EP. The third portion LP may cover an outer side surface of the contact insulating pattern 16. When viewed in a plan view, the third portion LP may enclose the insulating pillar CR and to have a ring shape. The first portion HP may cover a top surface of the contact insulating pattern 16. When viewed in a plan view, the first portion HP may enclose the second portion MP and to have a ring shape.

The second portion MP may be a portion that is disposed between the insulating pillar CR and the cell contact CC. A thickness t1 of the second portion MP in the third direction D3 may be larger than a thickness t2 of the first portion HP. The first protruding portion RP1 of the second portion MP may extend from a bottom surface of the first portion HP toward the first substrate 100 to cover the top surface of the insulating pillar CR. A bottom surface (e.g., the lowest portion of the bottom surface or a bottom) of the first protruding portion RP1 may be lower than the top surface of the contact insulating pattern 16 adjacent thereto. For example, the first protruding portion RP1 may cover at least a portion of an inner side surface of the contact insulating pattern 16. The horizontal insulating layer HL may extend into regions between the third portion LP and the contact insulating pattern 16, between the first portion HP and the contact insulating pattern 16, and between the second portion MP and the insulating pillar CR. The cell contact CC may penetrate the horizontal insulating layer HL and may be connected to the second portion MP. The horizontal insulating layer HL may not be provided between the cell contact CC and the second portion MP. The second portion MP may include a second protruding portion RP2 which extends from a top surface of the first portion HP in an opposite direction of the first substrate 100 (e.g., in the third direction D3). The horizontal insulating layer HL may expose at least a portion or the entirety of a top surface of the second protruding portion RP2, and thus, the second protruding portion RP2 may be in contact with the cell contact CC.

In an example embodiment, the bottom surface of the first protruding portion RP1 may include a region that is recessed in the third direction D3. The insulating pillar CR may include an upper portion filling the recessed region of the first protruding portion RP1. As an example, the upper portion of the insulating pillar CR may include an end portion that is tapered in the third direction D3, as shown in FIG. 8B. The first and second protruding portions RP1 and RP2 may have a mirror symmetry. In an example embodiment, the top surface of the second protruding portion RP2 may include a recessed region, and the cell contact CC may include a tapered end portion that is extended toward the recessed region.

Referring back to FIGS. 5, 6, and 7, the first chip CS may include a plurality of metal interconnection layers which are sequentially stacked. A first interconnection layer may penetrate the first upper insulating layer 20 and a second upper insulating layer 23. The first interconnection layer may include first contacts 31, which are connected to the bit line pads BPLG, and second contacts 32, which are connected to the cell contacts CC. A second interconnection layer may be provided on the first interconnection layer. The second interconnection layer may include first interconnection lines 34, which penetrate a third upper insulating layer 25 and connect to the first contacts 31, and second interconnection lines 35, which are connected to the second contacts 32. The first interconnection layer and the second interconnection layer may be formed of or include at least one of metallic materials (e.g., aluminum or tungsten).

First bonding metal patterns 38 and 39 may be provided in a fourth upper insulating layer 27 to be connected to the first and second interconnection lines 34 and 35. Some (e.g., 38) of the first bonding metal patterns 38 and 39 may be connected to the first and second interconnection lines 34 and 35, but the others 39 may not be connected to the first and second interconnection lines 34 and 35. The first bonding metal patterns 38 and 39 may include a metallic material that is different from the first and second interconnection layers. For example, the first bonding metal patterns 38 and 39 may be formed of or include copper (Cu).

The second chip PS may include a second substrate 200, peripheral circuits 215 integrated on the second substrate 200, and a peripheral interlayer insulating layer 210 provided on the second substrate 200 to cover the peripheral circuits 215. In an example embodiment, the second substrate 200 may be a single-crystalline silicon wafer. The electrode structure ST and the cell contacts CC of the first chip CS may be provided between the first substrate 100 of the first chip CS and the second chip PS. The peripheral circuits 215 may include row and column decoders, a page buffer, a control circuit, and so forth. In an example embodiment, the peripheral circuits 215 may include NMOS and PMOS transistors. The peripheral circuits 215 may be connected to the first chip CS through a plurality of metal interconnection layers. As an example, a first interconnection layer 240 and a second interconnection layer 230 may be provided on the peripheral circuits 215.

The second chip PS may include second bonding metal patterns 220. The second bonding metal patterns 220 may include a metallic material that is different from the first interconnection layer 240 and the second interconnection layer 230. For example, the second bonding metal patterns 220 may be formed of or include copper (Cu). At an interface between the first chip CS and the second chip PS, the second bonding metal patterns 220 may be in contact with the first bonding metal patterns 38 and 39 of the first chip CS. The peripheral interlayer insulating layer 210 may be in contact with the fourth upper insulating layer 27.

In the semiconductor device according to an example embodiment of the inventive concepts, it may be possible to form the penetration holes CH for the formation of the cell contacts CC at the same time, regardless of depths of the cell contacts CC. Further, because lower portions of the penetration holes CH are filled with the insulating pillars CR, not with a metallic material, it may be possible to reduce an amount of the metallic material and thereby to reduce a parasitic capacitance and a warpage risk, compared with the case in which a metallic material is used to fill the lower portions of the penetration holes CH. Thus, it may be possible to mitigate or prevent malfunction of the semiconductor device and to improve reliability of the semiconductor device.

Hereinafter, a method of fabricating a semiconductor device according to an example embodiment of the inventive concepts will be described in more detail with reference to FIGS. 9 to 32. FIGS. 9, 13, 17, 18, 20, 25, and 31 are sectional views, which are taken along a line A-A' of FIG. 5 to illustrate the fabrication method according to an example embodiment of the inventive concepts. FIGS. 10, 11, 12, 14, 15, 16, 19, 21, 22, 23, 26, 28, 30, and 32 are sectional views, which are taken along a line B-B' of FIG. 5 to illustrate the fabrication method according to an example embodiment of the inventive concepts. FIGS. 24, 27, and 29 are enlarged sectional views illustrating portions 'P2' of FIGS. 23, 26, and 28, respectively.

Figure 9:
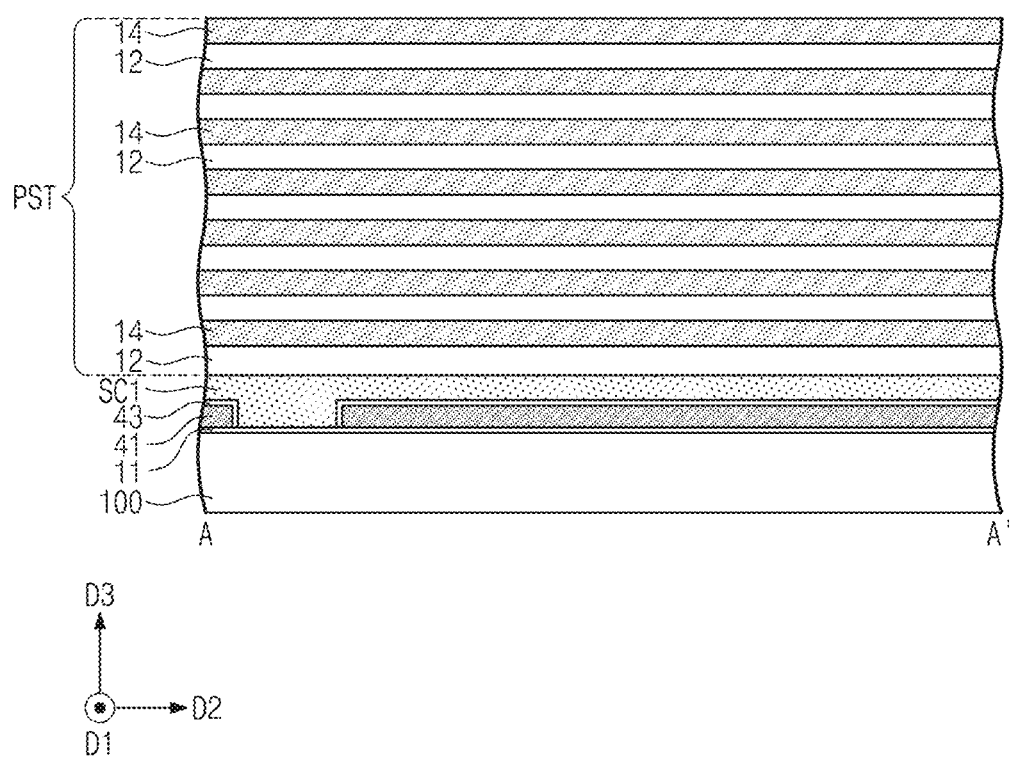
FIGS. 9, 13, 17, 18, 20, 25, and 31 are sectional views, which are taken along a line A-A' of FIG. 5 to illustrate a fabrication method according to an example embodiment of the inventive concepts.
Figure 10:
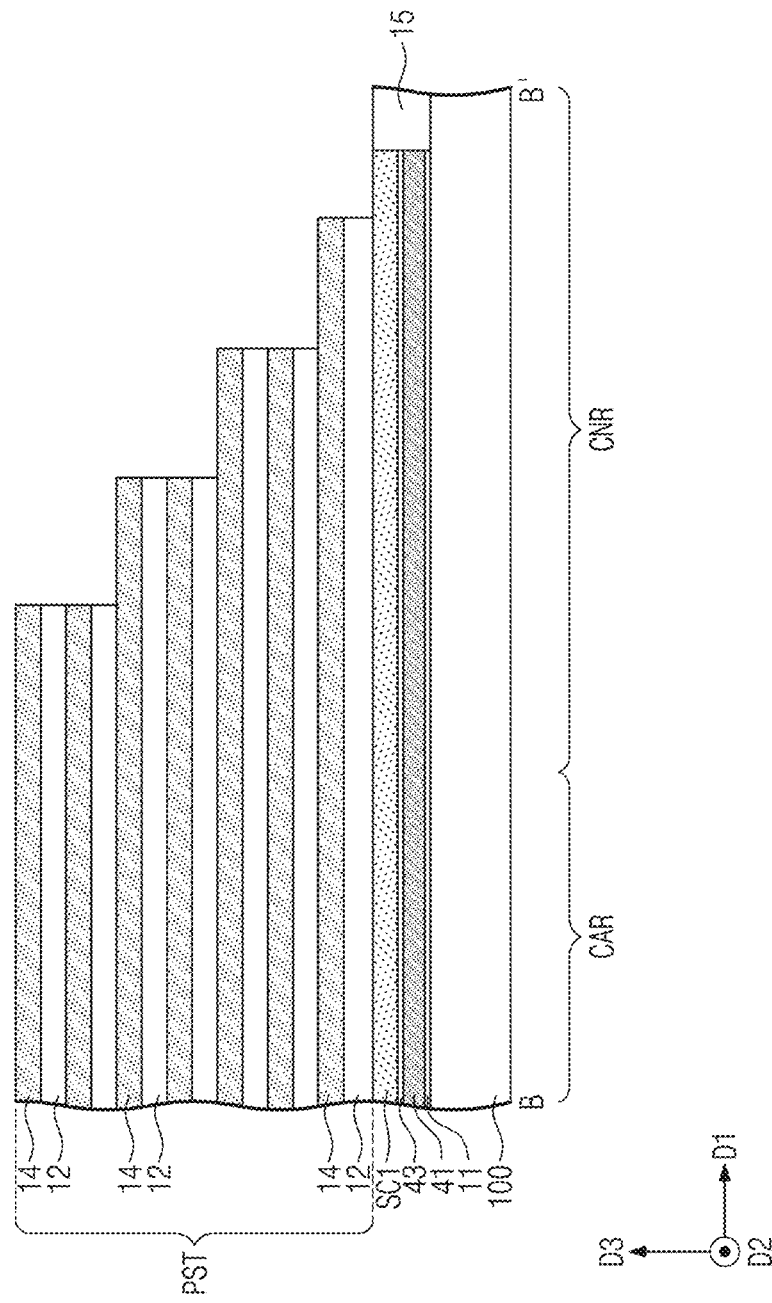
FIGS. 10, 11, 12, 14, 15, 16, 19, 21, 22, 23, 26, 28, 30, and 32 are sectional views, which are taken along a line B-B' of FIG. 5 to illustrate a fabrication method according to an example embodiment of the inventive concepts.

Referring to FIGS. 9 and 10, forming the buffer insulating layer 11 on the first substrate 100. The buffer insulating layer 11 may include at least one of, for example, a silicon oxide layer, a silicon germanium layer, and/or a poly-silicon layer. A deposition process and an etching process may be performed to form a lower sacrificial layer 41 on the buffer insulating layer 11. A portion of the lower sacrificial layer 41 on the cell array region CAR may be patterned to expose a top surface of the buffer insulating layer 11. An auxiliary buffer insulating layer 43 may be formed to cover top and side surfaces of the lower sacrificial layer 41. The auxiliary buffer insulating layer 43 may include, for example, a silicon oxide layer. The first source pattern SC1 may be formed on the auxiliary buffer insulating layer 43. The first source pattern SC1 may include a doped semiconductor layer. As an example, the first source pattern SC1 may be formed of or include poly silicon.

A lower hole may be formed by sequentially etching the first source pattern SC1, the auxiliary buffer insulating layer 43, the lower sacrificial layer 41, the buffer insulating layer 11, and the first substrate 100 on the connection region CNR, and then, the substrate insulating pattern 15 may be formed to fill the lower hole. The substrate insulating pattern 15 may be formed of or include silicon oxide.

A preliminary stack structure PST may be formed by alternately stacking the electrode interlayer insulating layers 12 and mold sacrificial layers 14 on the first source pattern SC1. The electrode interlayer insulating layers 12 may be formed of or include, for example, silicon oxide. The mold sacrificial layers 14 may be formed of or include a material (e.g., silicon nitride) having an etch selectivity with respect to the electrode interlayer insulating layers 12. A trimming process and an etching process may be repeatedly performed to form a stepwise structure, which is defined by end portions of the electrode interlayer insulating layers 12 and the mold sacrificial layers 14, on the connection region CNR.

Figure 11:
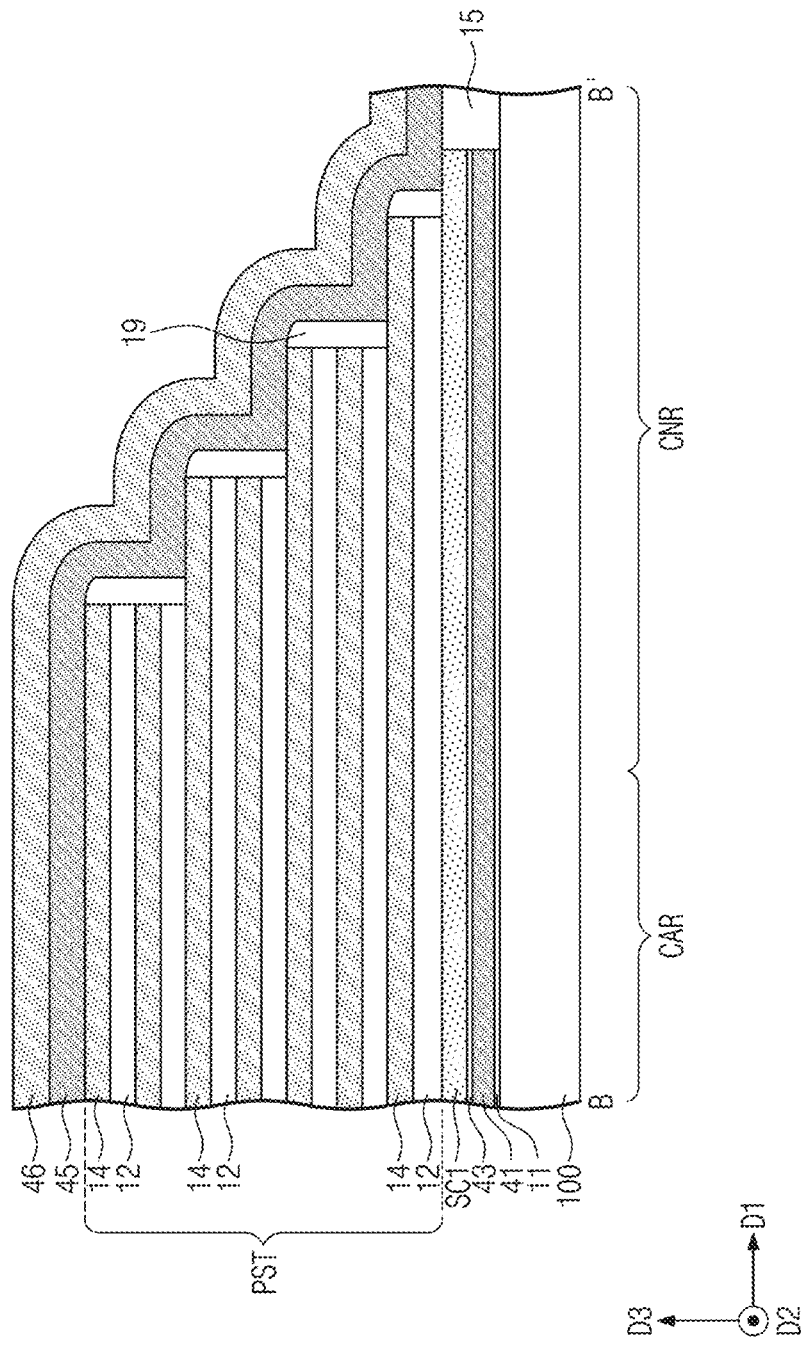

Referring to FIG. 11, the pad insulating patterns 19 may be formed to cover side surfaces of the electrode interlayer insulating layers 12 and the mold sacrificial layers 14. The pad insulating patterns 19 may be formed by depositing an insulating layer (e.g., a silicon oxide layer) and performing an anisotropic etching process on the insulating layer. A pad sacrificial layer 45 and a mask layer 46 may be sequentially formed to cover the preliminary stack structure PST. The pad sacrificial layer 45 may be formed of or include a material having an etch selectivity with respect to the electrode interlayer insulating layers 12 and the mold sacrificial layers 14. As an example, the pad sacrificial layer 45 may include a poly silicon layer. The mask layer 46 may include a silicon nitride layer or a silicon oxynitride layer. In an example embodiment, the mask layer 46 may be formed of the same material as the mold sacrificial layers 14.

Figure 12:
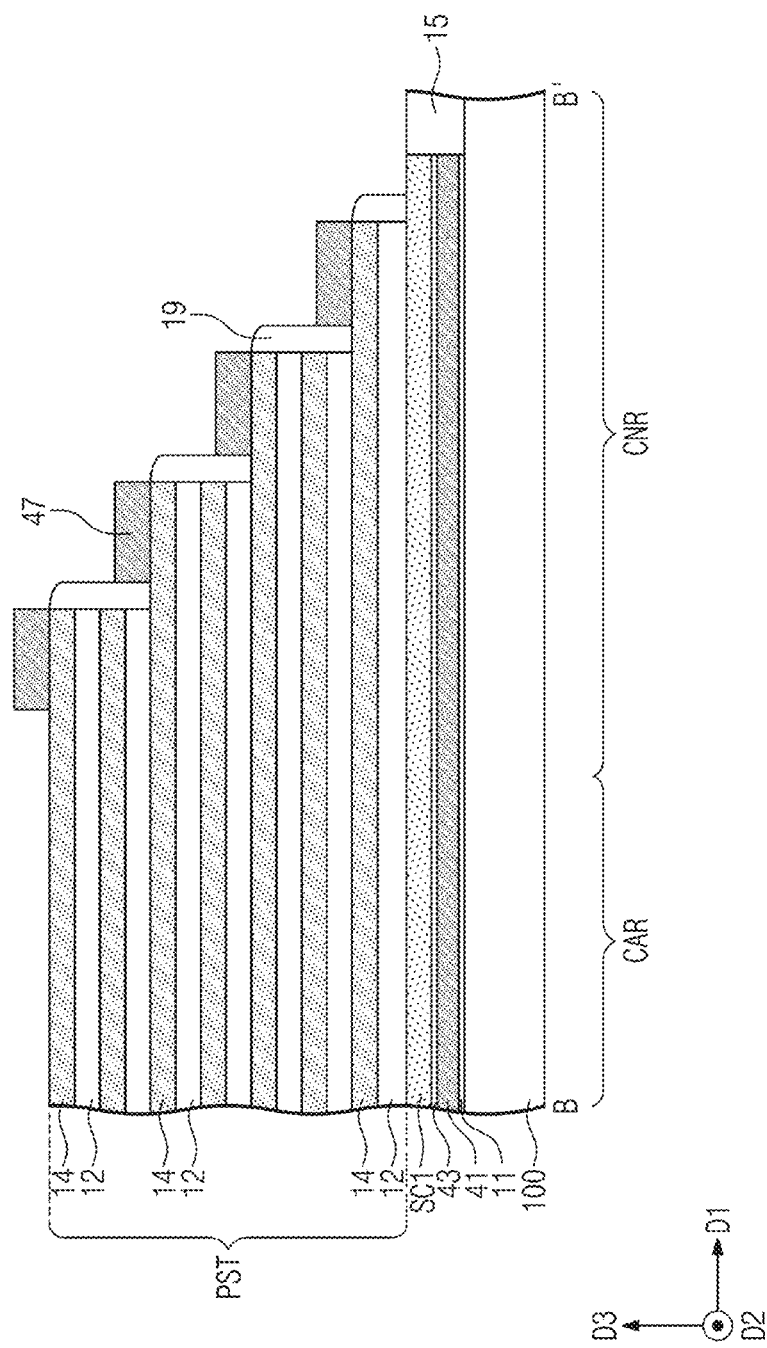

Referring to FIG. 12, the mask layer 46 may be patterned to form mask patterns, and then, pad sacrificial patterns 47 may be formed by etching the pad sacrificial layer 45 using the mask patterns as an etch mask. Thereafter, the mask patterns may be removed, but in an example embodiment, the mask patterns may be partially left on the pad sacrificial patterns 47, as will be described with reference to FIGS. 37 to 42.

Figure 13:
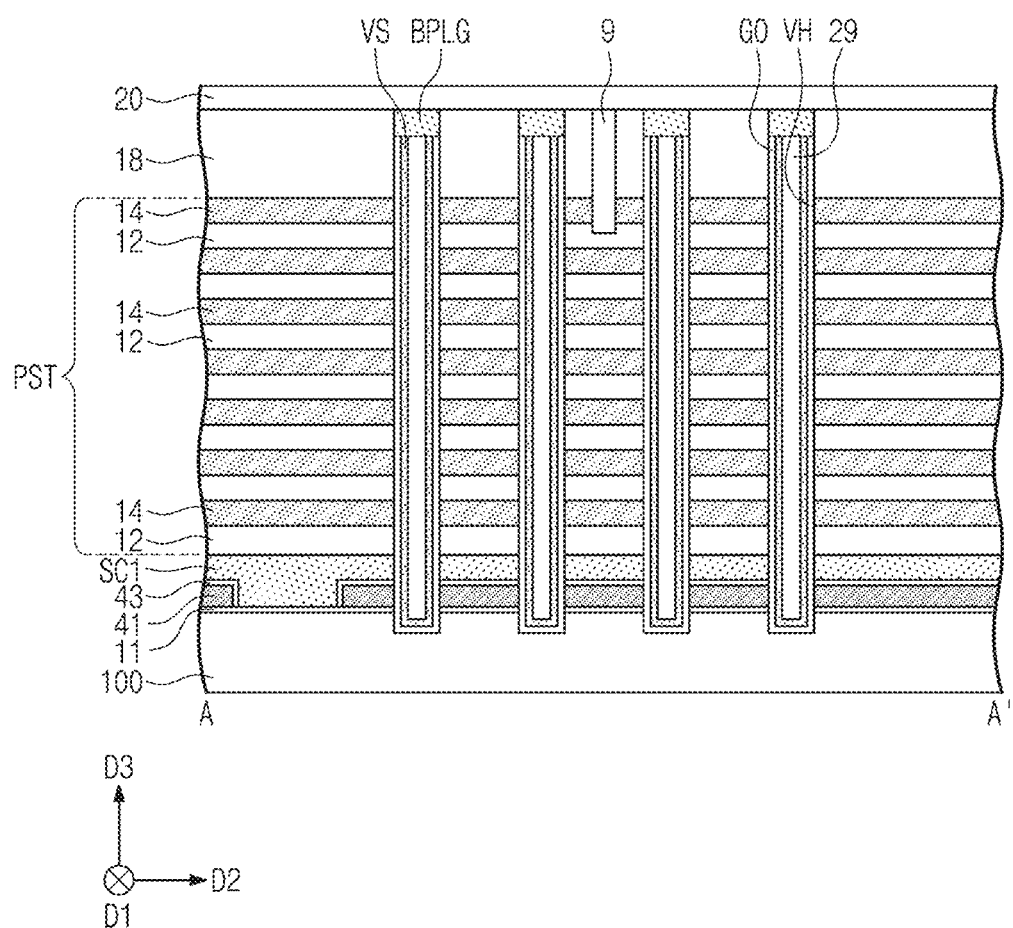
Figure 14:
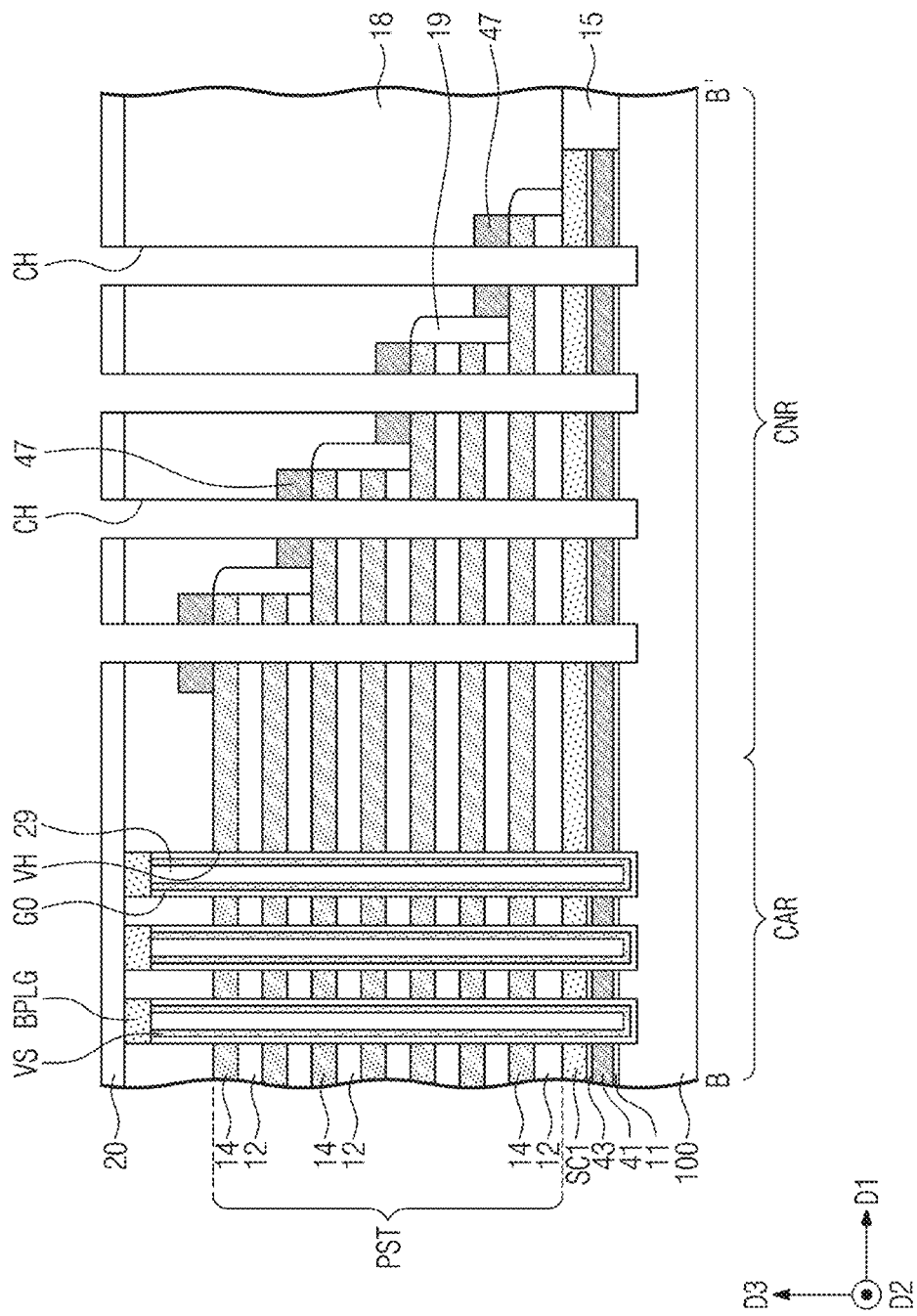

Referring to FIGS. 13 and 14, the planarization insulating layer 18 may be formed to cover the preliminary stack structure PST. The planarization insulating layer 18 may include a silicon oxide layer. Vertical holes VH may be formed to penetrate the planarization insulating layer 18, the preliminary stack structure PST, the first source pattern SC1, the auxiliary buffer insulating layer 43, the lower sacrificial layer 41, and the buffer insulating layer 11, and expose the first substrate 100. The gate insulating layer GO and the cell vertical patterns VS may be sequentially formed to conformally cover inner surfaces of the vertical holes VH. Next, the insulating gap-fill patterns 29 may fill the vertical holes VH. The bit line pads BPLG may be formed by removing portions of the insulating gap-fill patterns 29, the cell vertical patterns VS, and the gate insulating layer GO, which are located at upper portions of the vertical holes VH, and filling the removed portions with a conductive layer. The first and second dummy vertical patterns DVS1 and DVS2 described with reference to FIG. 5 may be formed by the same process as the process of forming at least a portion of the gate insulating layer GO, the cell vertical patterns VS, the insulating gap-fill patterns 29, and the bit line pads BPLG.

On the cell array region CAR, the planarization insulating layer 18 and the uppermost one of the mold sacrificial layers 14 may be partially removed to form a recess region, which extends in the first direction D1, and then the insulating separation pattern 9 may be formed by filling the recess region with an insulating layer. The insulating separation pattern 9 may be formed of or include silicon oxide.

The first upper insulating layer 20 may be formed on the planarization insulating layer 18. The penetration holes CH may be formed on the connection region CNR to penetrate the first upper insulating layer 20, the planarization insulating layer 18, the pad sacrificial patterns 47, and the preliminary stack structure PST. The penetration holes CH may be formed to penetrate the first source pattern SC1 and the lower sacrificial layer 41 and to expose the first substrate 100. In some example embodiments, the penetration holes CH may be formed to have bottom surfaces that are located at a level higher than the top surface of the first source pattern SC1.

Figure 15:
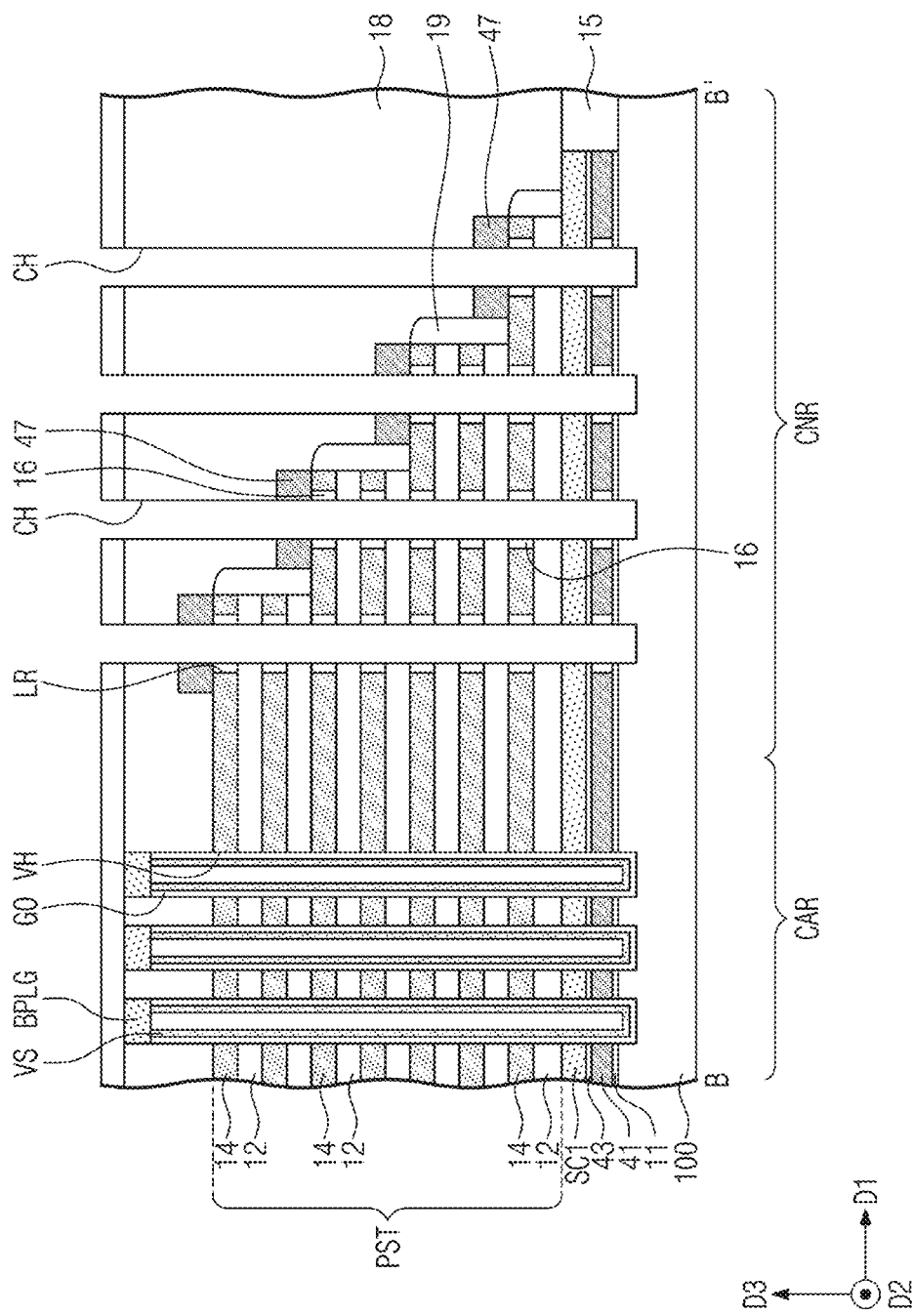

Referring to FIG. 15, portions of the mold sacrificial layers 14 may be removed by performing an isotropic etching process on the mold sacrificial layers 14, which are exposed through the penetration holes CH. As a result of the partial removal of the mold sacrificial layers 14, horizontal recess regions LR may be formed near the penetration holes CH. In the case where the lower sacrificial layer 41 includes the same material as the mold sacrificial layers 14, a portion of the lower sacrificial layer 41 may also be removed during the isotropic etching process, and in this case, the horizontal recess region LR may also be formed between the lower sacrificial layer 41 and the penetration hole CH. The formation of the horizontal recess region LR may be performed using a recipe that is chosen to suppress or minimize an etching of the pad sacrificial patterns 47 and the planarization insulating layer 18.

The contact insulating patterns 16 may be formed to fill the horizontal recess regions LR, respectively. The contact insulating patterns 16 may be formed of or include silicon oxide. The contact insulating patterns 16 may be formed by forming an insulating layer in the penetration holes CH and performing an isotropic etching process on the insulating layer. As a result, portions of the insulating layer may be left in the horizontal recess regions LR to form the contact insulating patterns 16.

Figure 16:
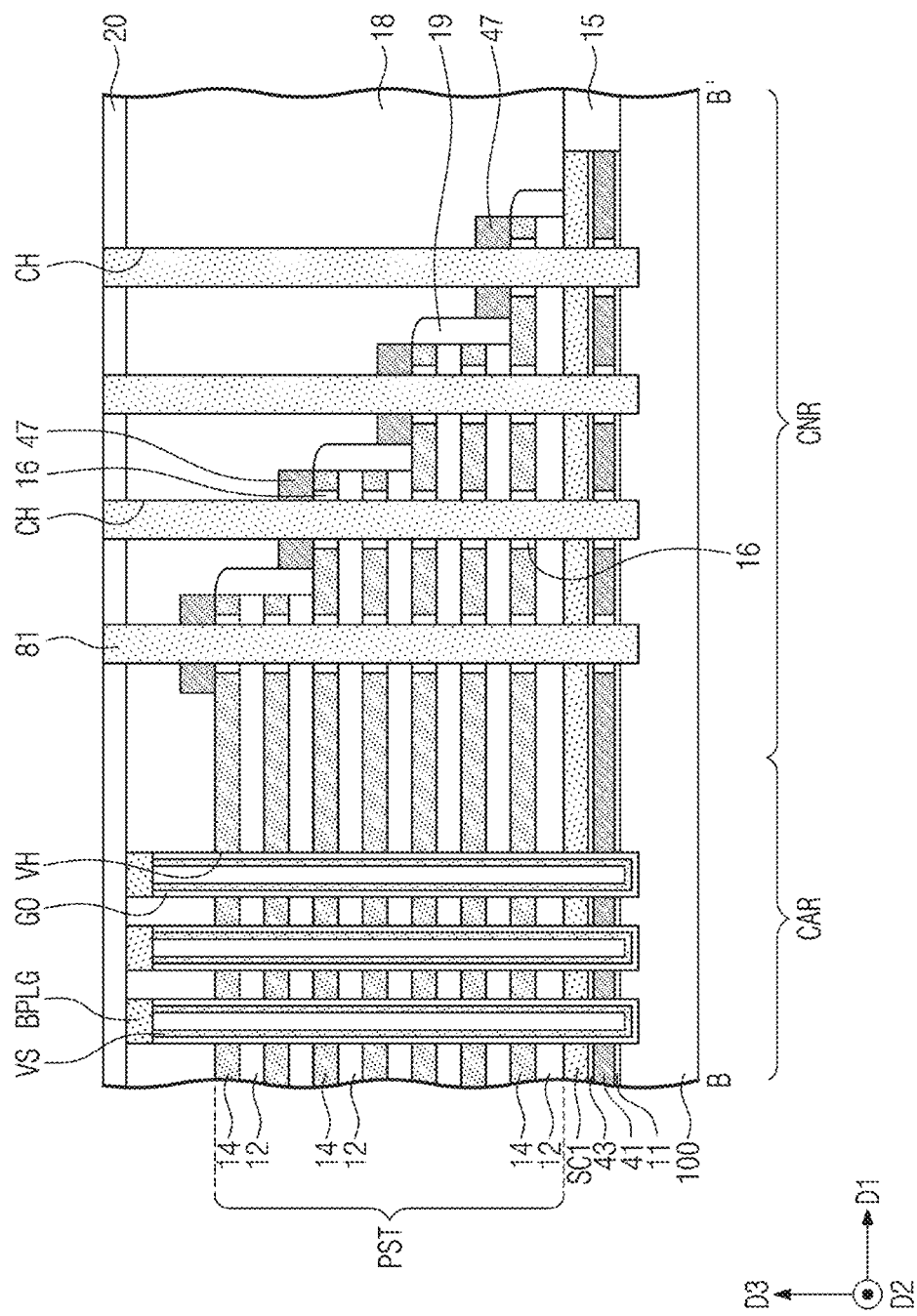

Referring to FIG. 16, preliminary insulating pillars 81 may be formed to fill the penetration holes CH, respectively.

The formation of the preliminary insulating pillars 81 may include forming an insulating layer to fill the penetration holes CH and performing a planarization process on the insulating layer. The preliminary insulating pillars 81 may be formed of or include at least one of silicon nitride or silicon oxynitride. In an example embodiment, the preliminary insulating pillars 81 may be formed of or include the same material as the mold sacrificial layers 14. The preliminary insulating pillars 81 may be spaced apart from the mold sacrificial layers 14 by the contact insulating patterns 16.

Figure 17:
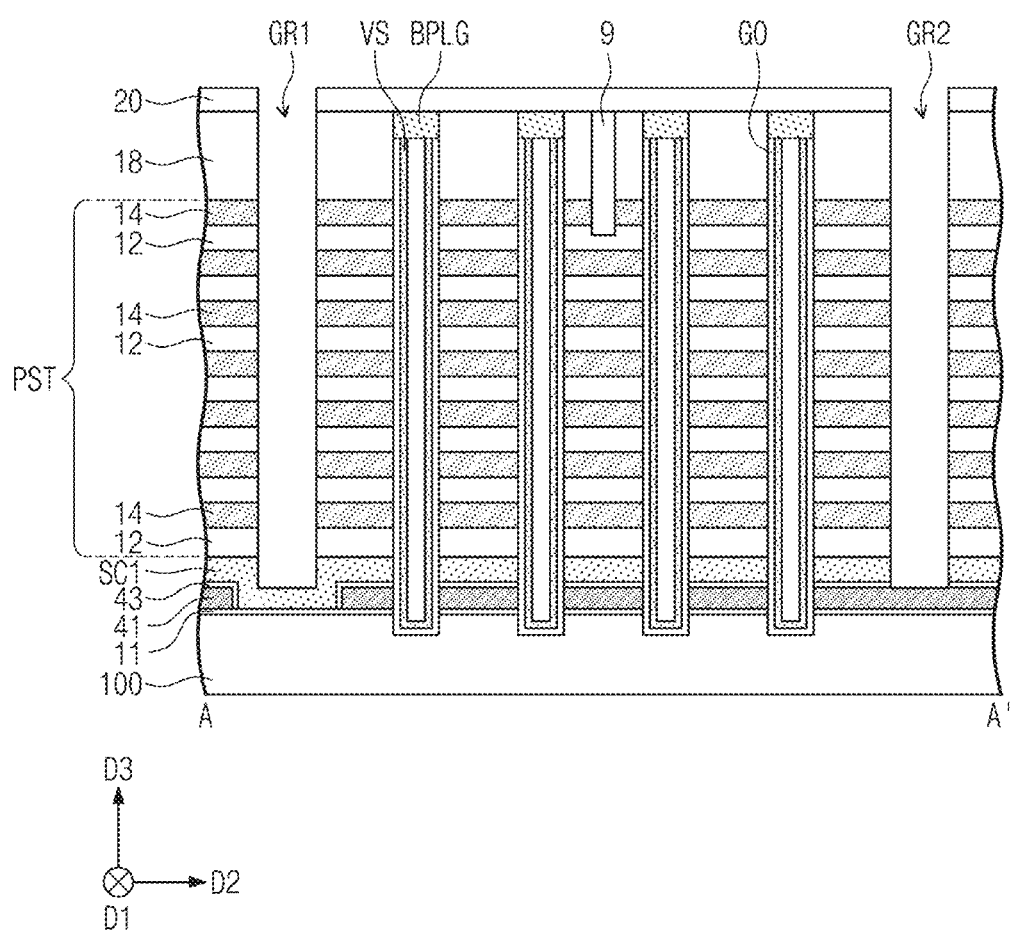

Referring to FIG. 17, the first and second grooves GR1 and GR2 may be formed on the cell array region CAR by etching the first upper insulating layer 20, the planarization insulating layer 18, the first source pattern SC1, and the auxiliary buffer insulating layer 43. The first groove GR1 may be formed to be spaced apart from the lower sacrificial layer 41. The second groove GR2 may be formed to expose the lower sacrificial layer 41.

Figure 18:
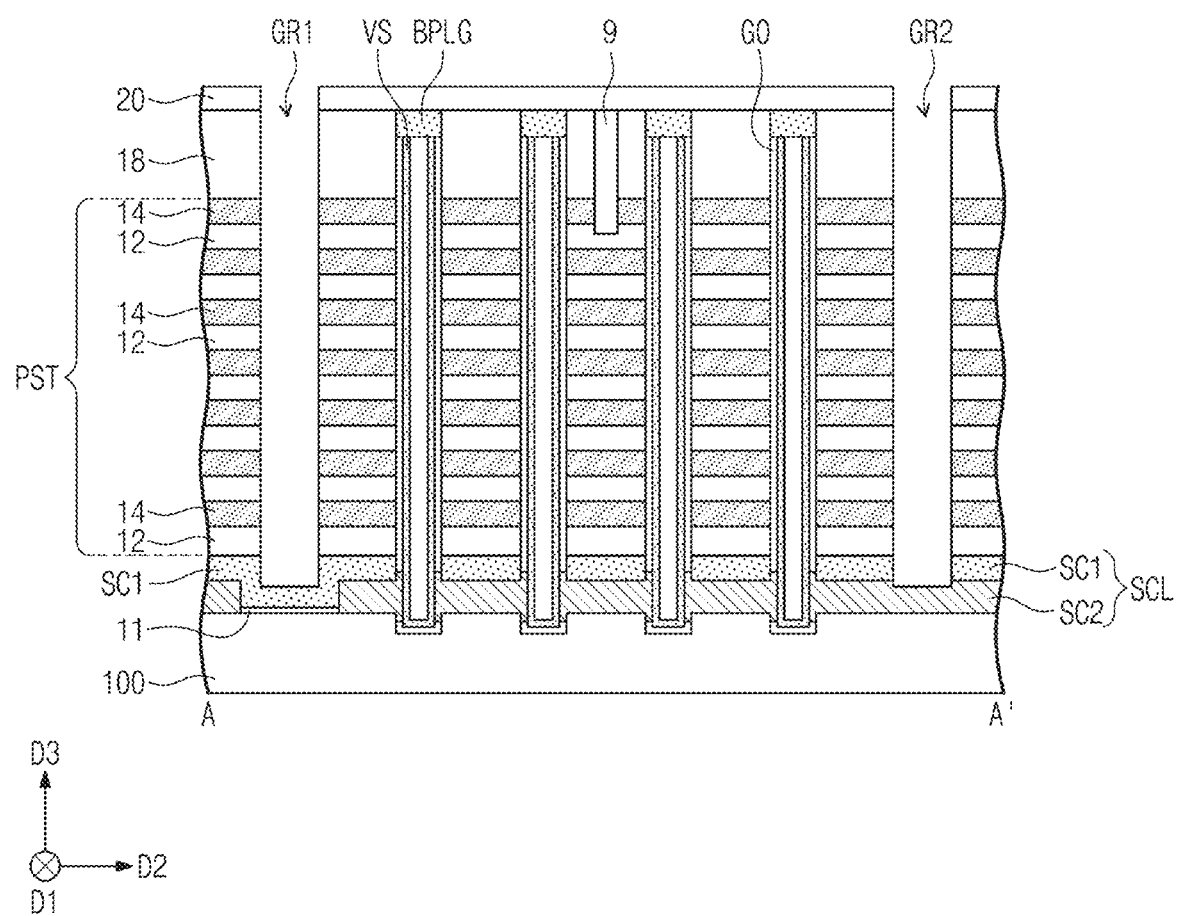
Figure 19:
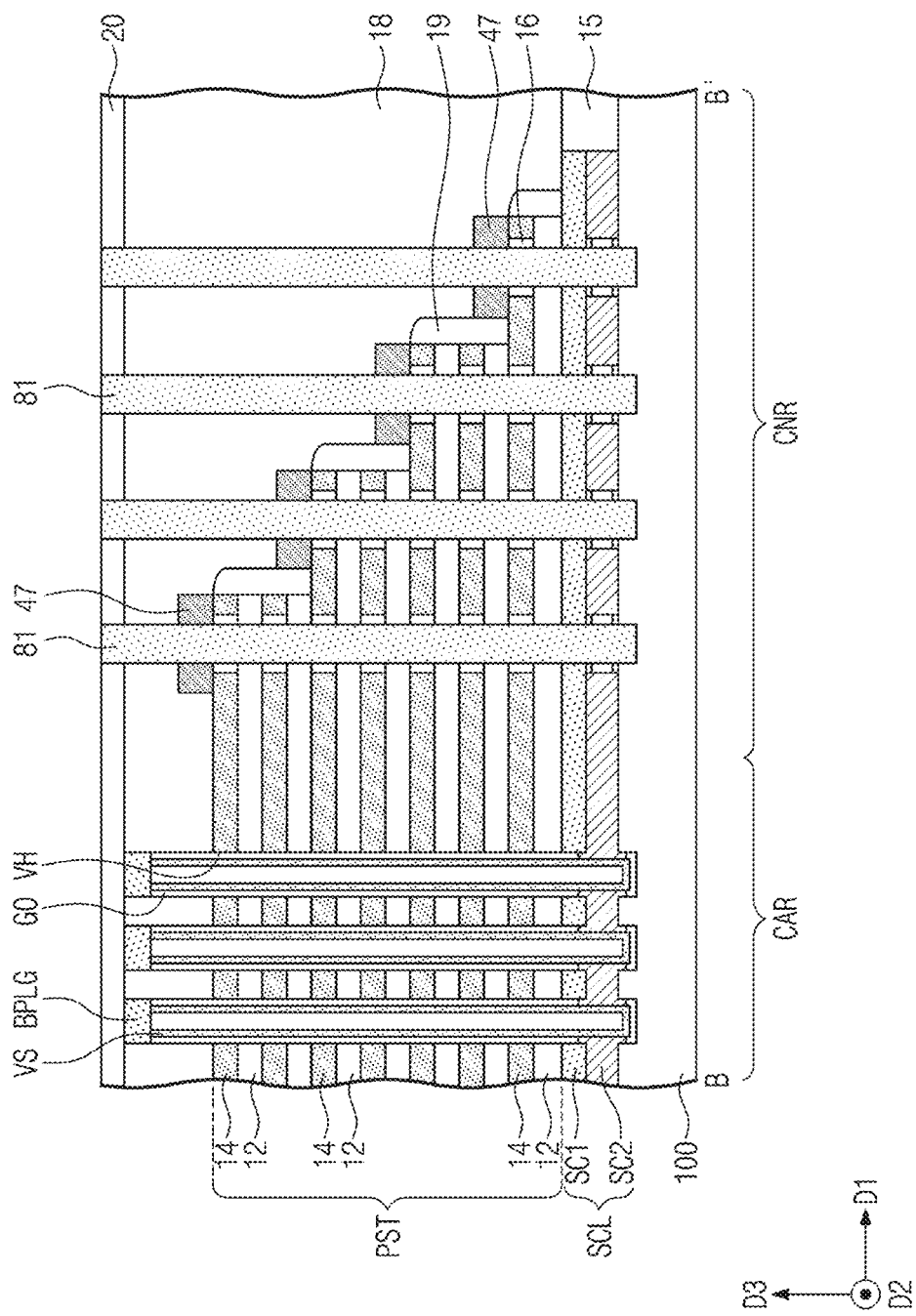

Referring to FIGS. 18 and 19, lower side surfaces of the cell vertical patterns VS, a top surface of the first substrate 100, and a bottom surface of the first source pattern SC1 may be exposed by removing the lower sacrificial layer 41, the auxiliary buffer insulating layer 43, a portion of the buffer insulating layer 11, and a portion of the gate insulating layer GO through the second groove GR2. Thereafter, a conductive layer may be deposited to fill the first and second grooves GR1 and GR2 and a space between the first source pattern SC1 and the first substrate 100, and then, the second source pattern SC2 may be formed in the space between the first source pattern SC1 and the first substrate 100 by removing the conductive layer from the first and second grooves GR1 and GR2. Thus, the source structure SCL including the first and second source patterns SC1 and SC2 may be formed. The second source pattern SC2 may be formed of or include a single- or poly-crystalline doped silicon material that is of an n- or p-type. The second source pattern SC2 may be formed to penetrate a portion of the gate insulating layer GO and may be connected to the exposed lower side surfaces of the cell vertical patterns VS. The second source pattern SC2 may be spaced apart from the preliminary insulating pillars 81 with the contact insulating patterns 16 interposed therebetween, but in an example embodiment, the contact insulating patterns 16 may not be provided between the second source pattern SC2 and the preliminary insulating pillars 81.

Figure 20:
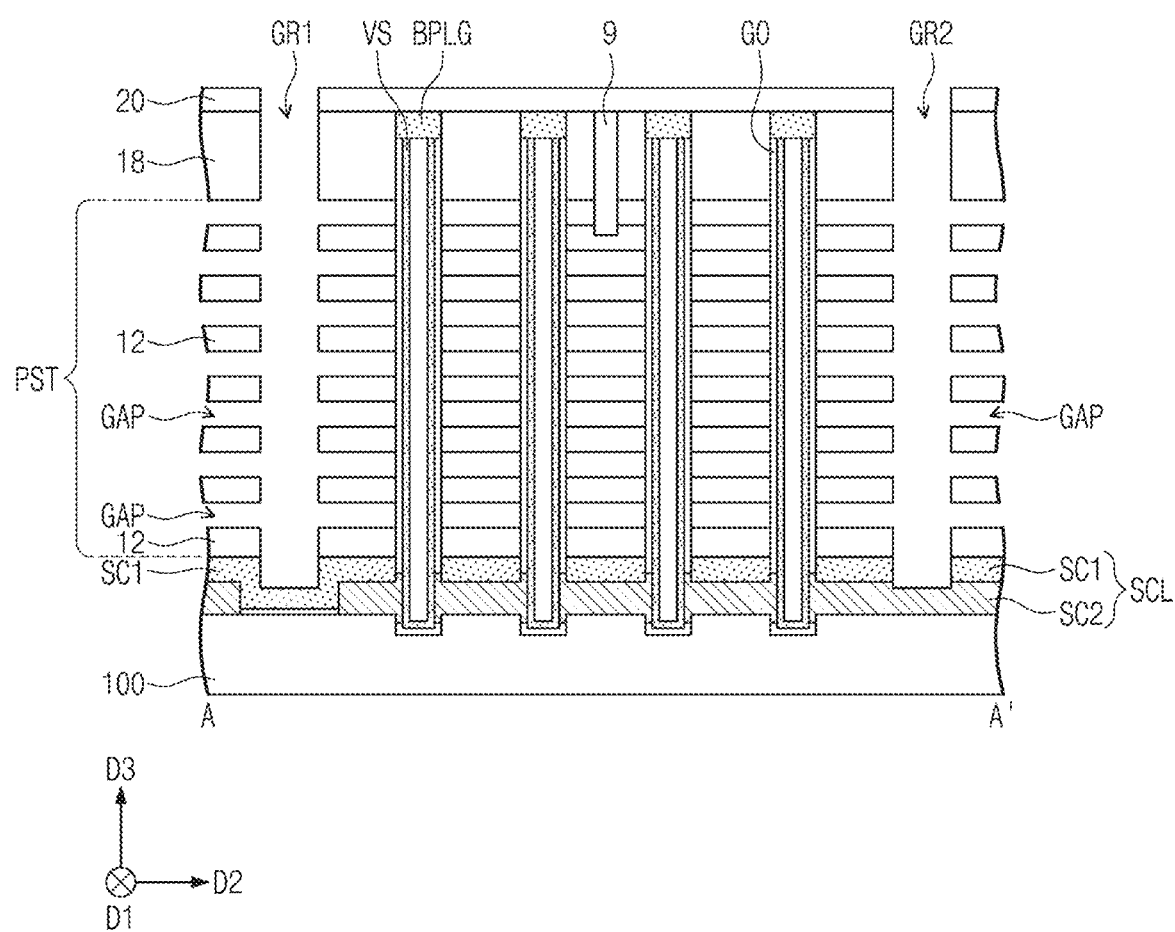
Figure 21:
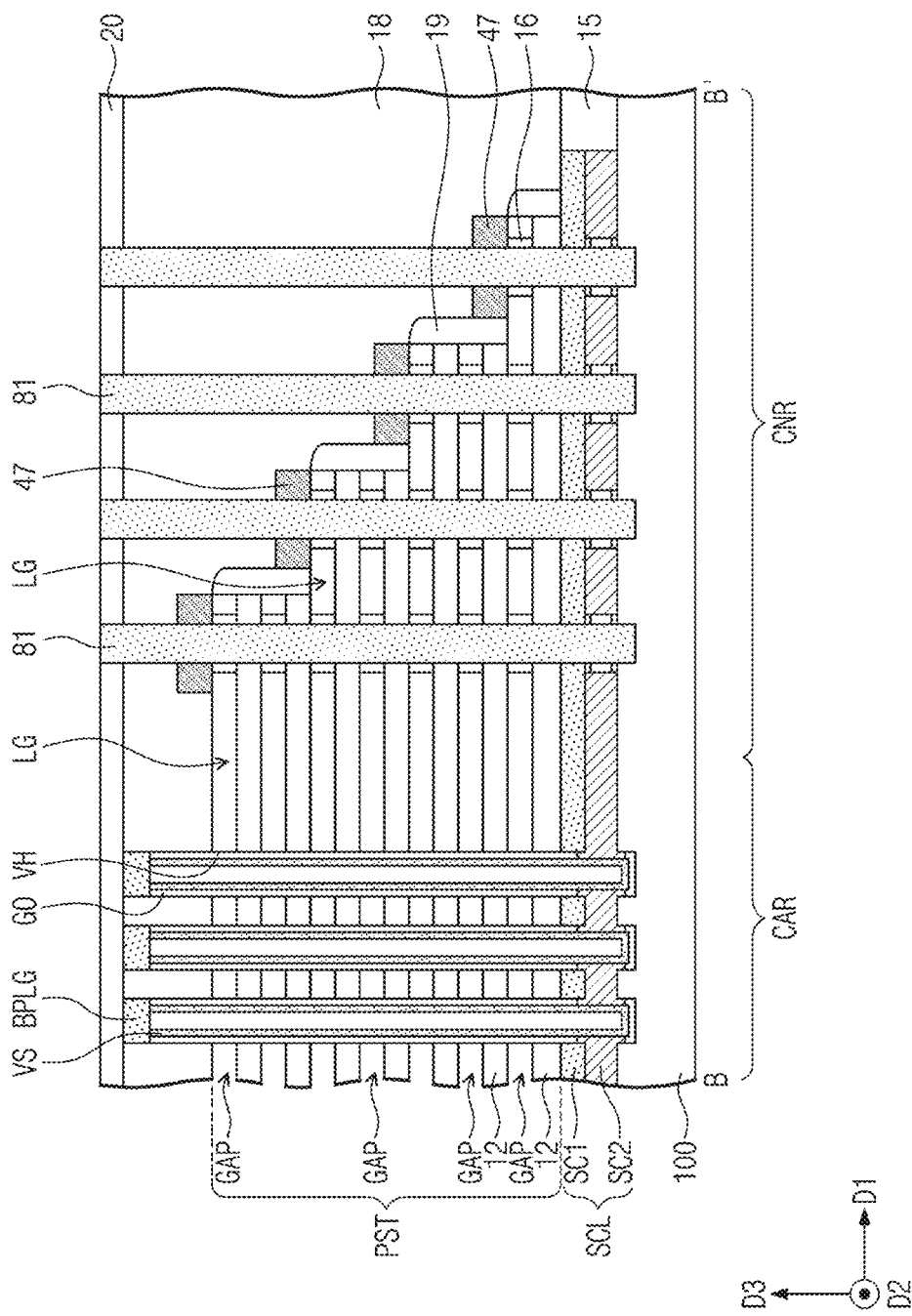

Referring to FIGS. 20 and 21, gap regions GAP may be formed by selectively removing the mold sacrificial layers 14 through the first and second grooves GR1 and GR2. Accordingly, a line region LG may be formed, and the line portion EP of the electrodes EL and the third portion LP of the pad portion PP of the electrodes EL may be provided in the line region LG. The gap regions GAP may be formed to expose side surfaces of the contact insulating pattern 16 and bottom surfaces of the pad sacrificial patterns 47, and the preliminary insulating pillars 81 may not be removed when the mold sacrificial layers 14 are removed, because the preliminary insulating pillars 81 are protected by the contact insulating pattern 16 and the pad sacrificial patterns 47.

Figure 22:
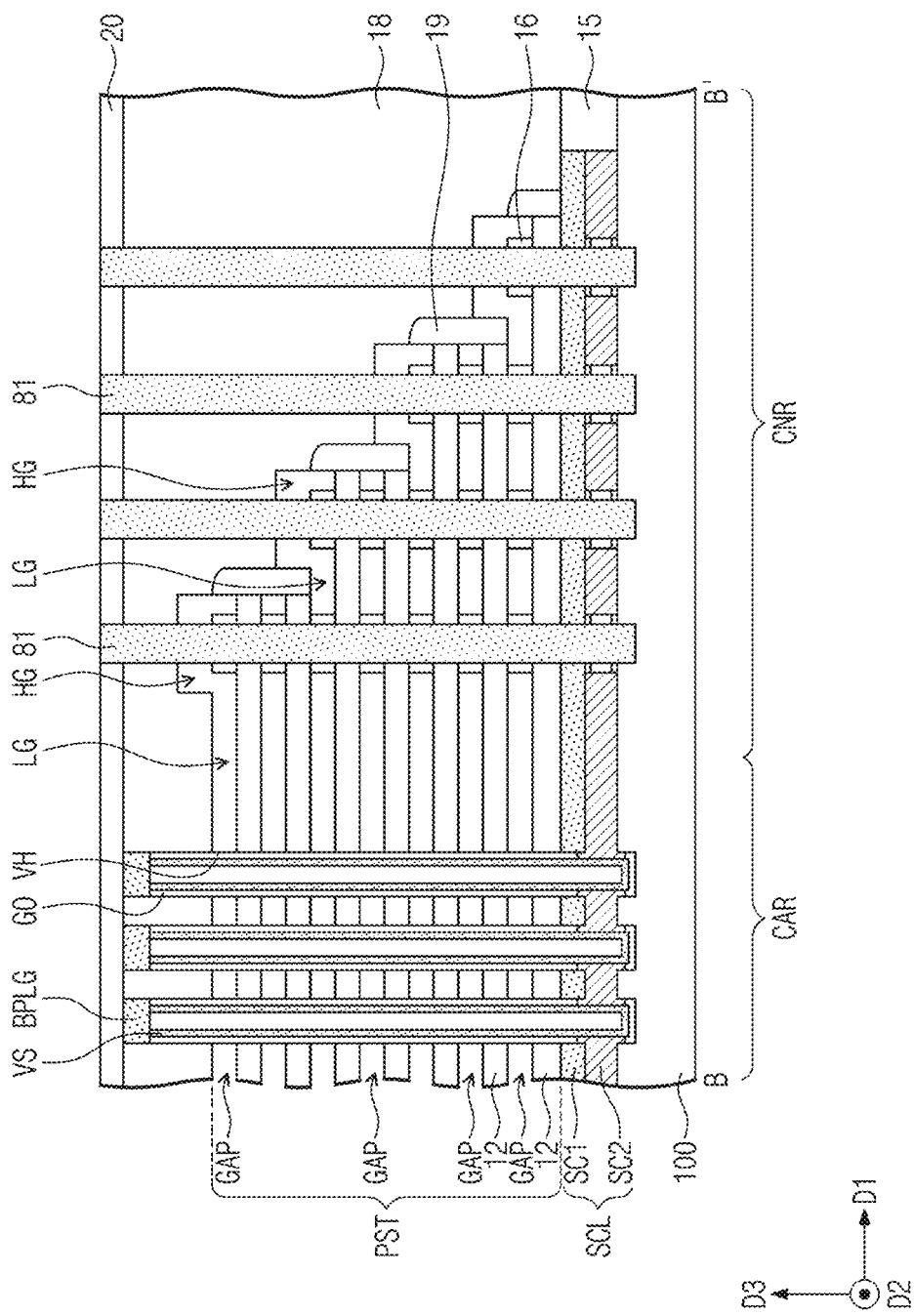

Referring to FIG. 22, first recess regions HG, which are extended from the gap regions GAP, may be formed by removing the pad sacrificial patterns 47 exposed through the gap regions GAP. In an example embodiment, the removal of the pad sacrificial patterns 47 may be performed using an etchant which can selectively remove a silicon material and block or prevent a silicon oxide layer and silicon nitride layer from being etched. The first recess regions HG may be formed to expose side surfaces of the preliminary insulating pillars 81. When viewed in a plan view, each of the first recess regions HG may be a ring-shaped region exposing the side surfaces of the preliminary insulating pillars 81.

Figure 23:
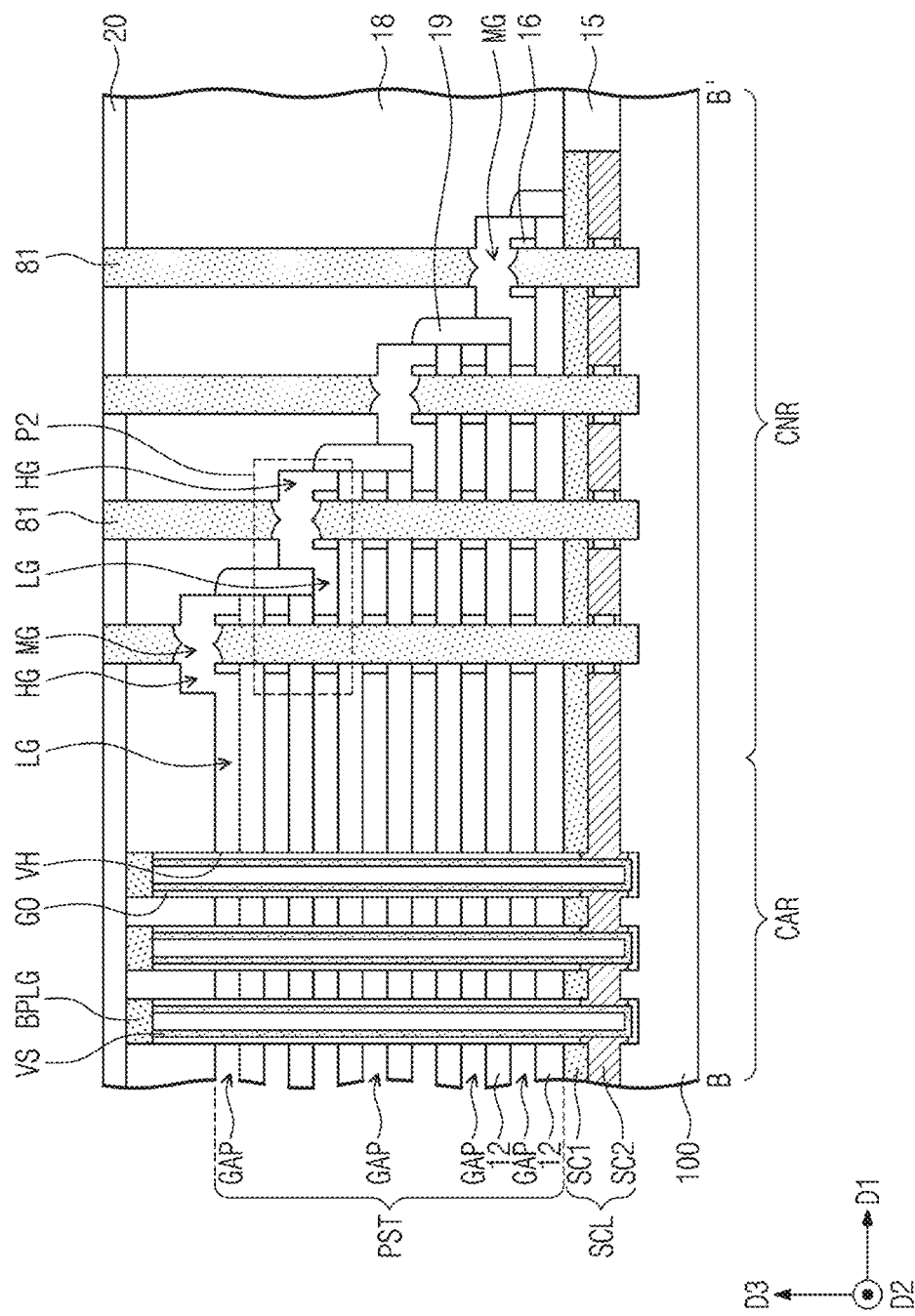
Figure 24:
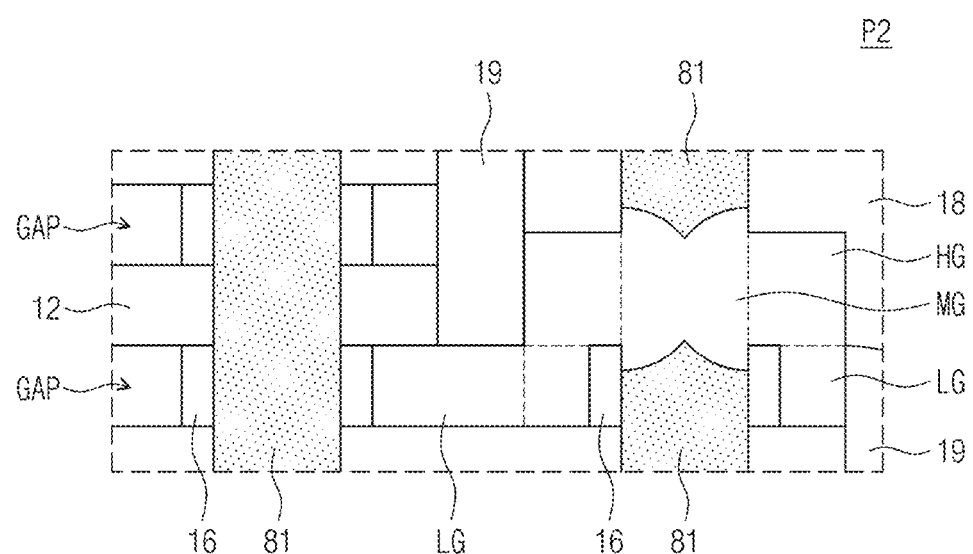
FIGS. 24, 27, and 29 are enlarged sectional views illustrating portions 'P2' of FIGS. 23, 26, and 28, respectively.

Referring to FIGS. 23 and 24, second recess regions MG, which extend from the gap regions GAP, may be formed by performing an isotropic etching process on the preliminary insulating pillars 81. A thickness of the second recess regions MG in the third direction D3 may be larger than a thickness of a first recess region HG. Each of the preliminary insulating pillars 81 may be divided into two patterns which are vertically spaced apart from each other with the second recess region MG interposed therebetween. Side surfaces of the preliminary insulating pillars 81, which are not exposed through the first recess regions HG, may be protected by the contact insulating pattern 16 and may not be etched during the above etching process. The shape of the second recess regions MG may be variously changed depending on an etching direction in the etching process and the material of the preliminary insulating pillars 81. As an example, when viewed in a sectional view, because the etching process through the first recess regions HG is performed in both of the first direction D1 and an opposite direction thereof, the second recess region MG may have a shape in which a pair of hemispheres partially overlapping each other, as shown in FIG. 24. The second recess regions MG may extend to expose an inner side surface of the contact insulating pattern 16 thereunder.

Figure 25:
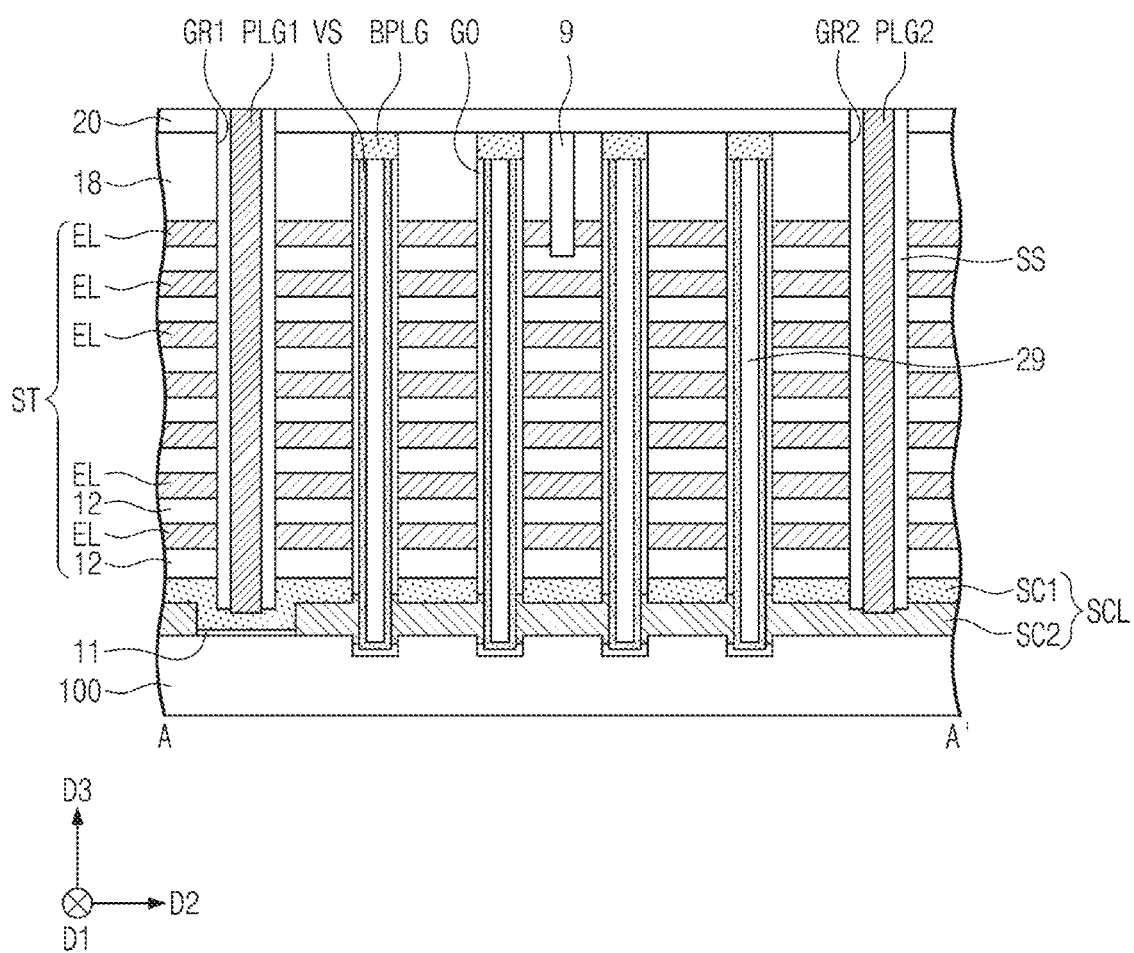
Figure 26:
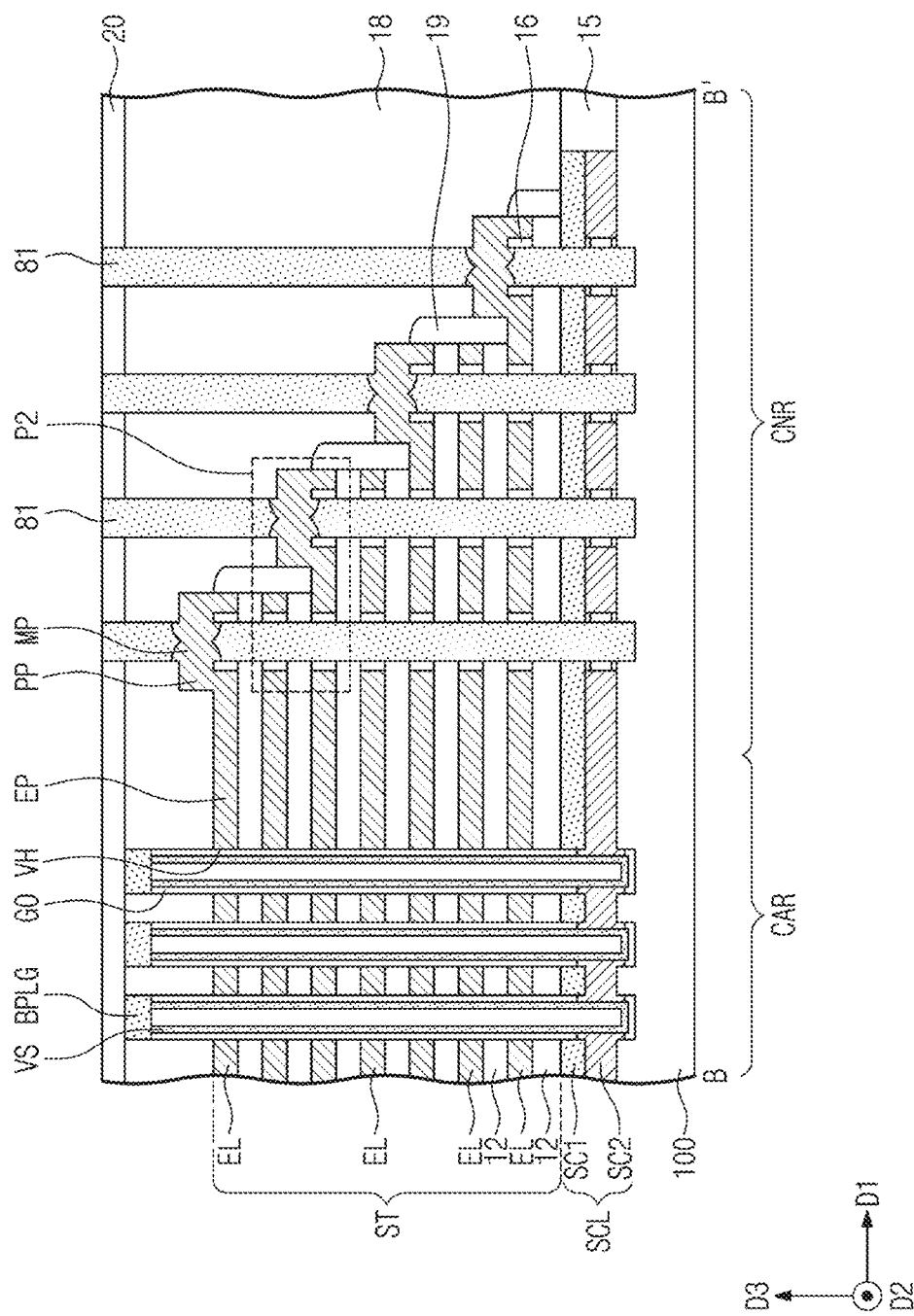
Figure 27:
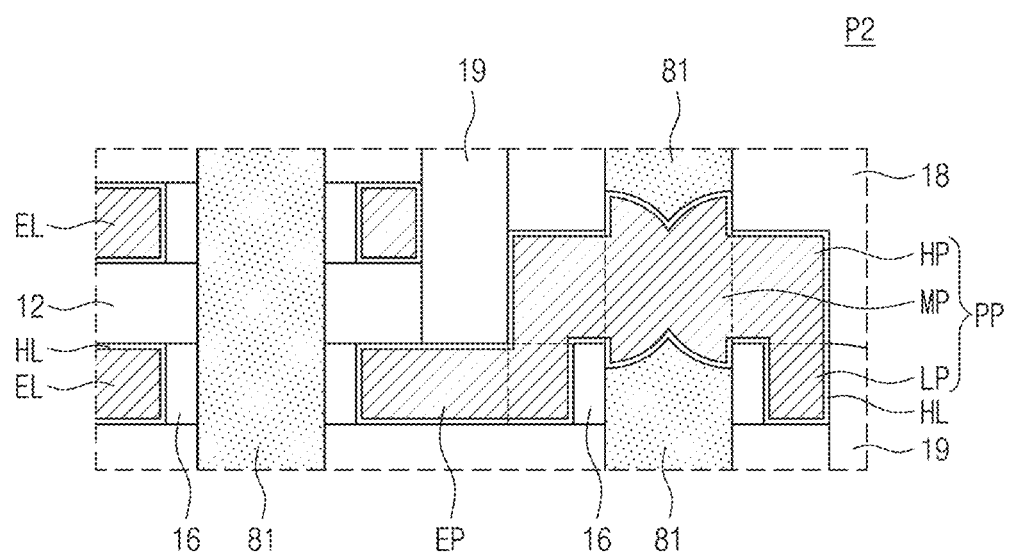

Referring to FIGS. 25, 26, and 27, the horizontal insulating layer HL and the electrodes EL may be formed to sequentially fill the gap regions GAP. For example, the horizontal insulating layer HL may be formed to conformally cover inner surfaces of the first groove GR1, the second groove GR2, and the gap regions GAP, and then a conductive layer may be formed to fill the remaining spaces of the first groove GR1, the second groove GR2, and the gap regions GAP. Thereafter, the electrodes EL may be formed in the gap regions GAP by removing the horizontal insulating layer HL and the conductive layer from the first groove GR1 and the second groove GR2. The electrode interlayer insulating layers 12 and the electrodes EL, which are alternately stacked as a result of the above process, may form the electrode structure ST. The horizontal insulating layer HL may have a higher dielectric constant than the silicon oxide layer and may include a metal oxide layer (e.g., a hafnium oxide layer or an aluminum oxide layer). The electrodes EL may be formed of or include a metallic material (e.g., tungsten). Each of the electrodes EL may include the line portion EP and the pad portion PP that are provided on the cell array region CAR and the connection region CNR, respectively. The pad portion PP may include the first portion HP, the second portion MP, and the third portion LP. The horizontal insulating layer HL may be formed to cover top and bottom surfaces of the second portion MP.

The insulating spacers SS may be formed to cover inner side surfaces of the first and second grooves GR1 and GR2, and then the source contact plugs PLG1 and PLG2 may be formed to fill the first and second grooves GR1 and GR2.

Figure 28:
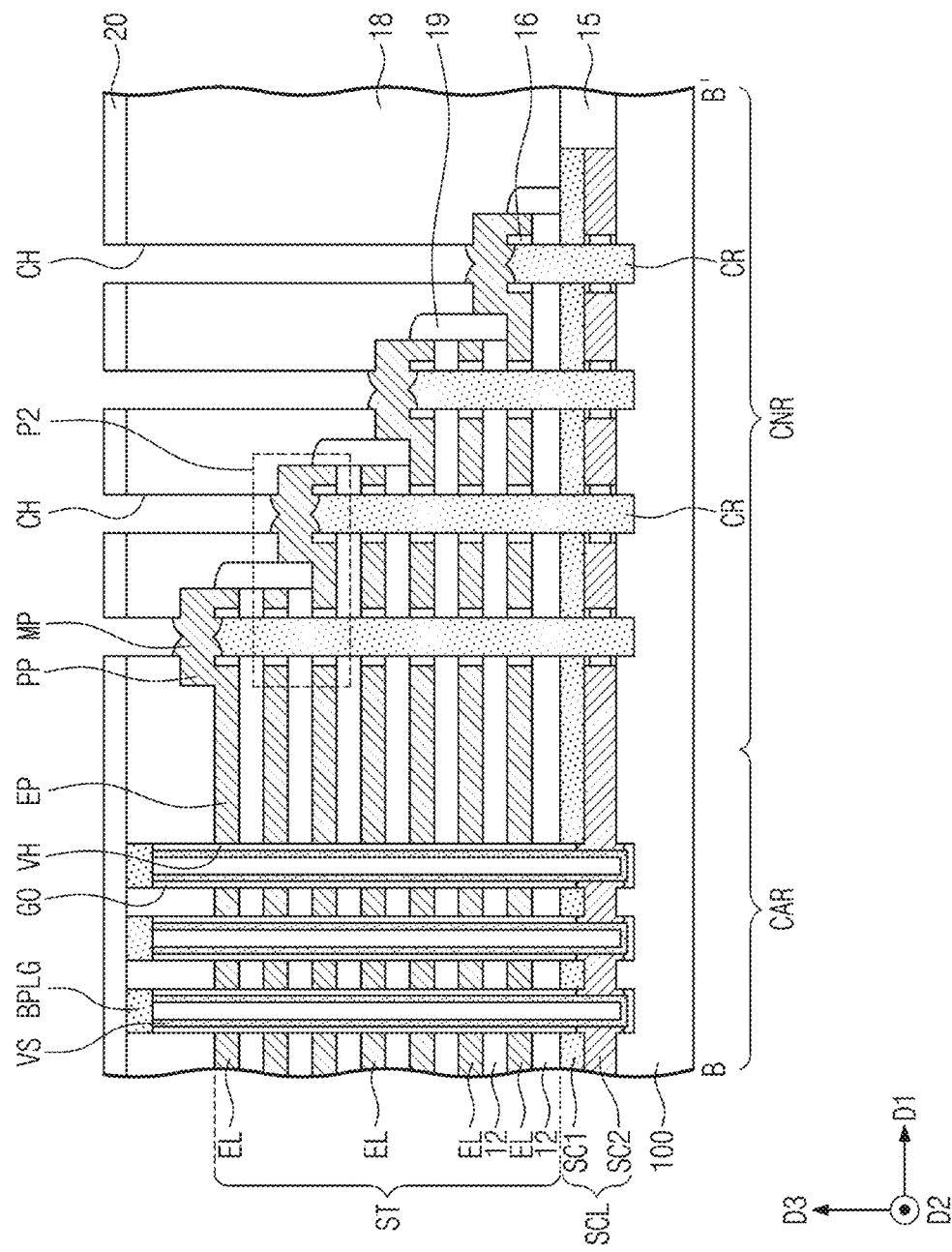
Figure 29:
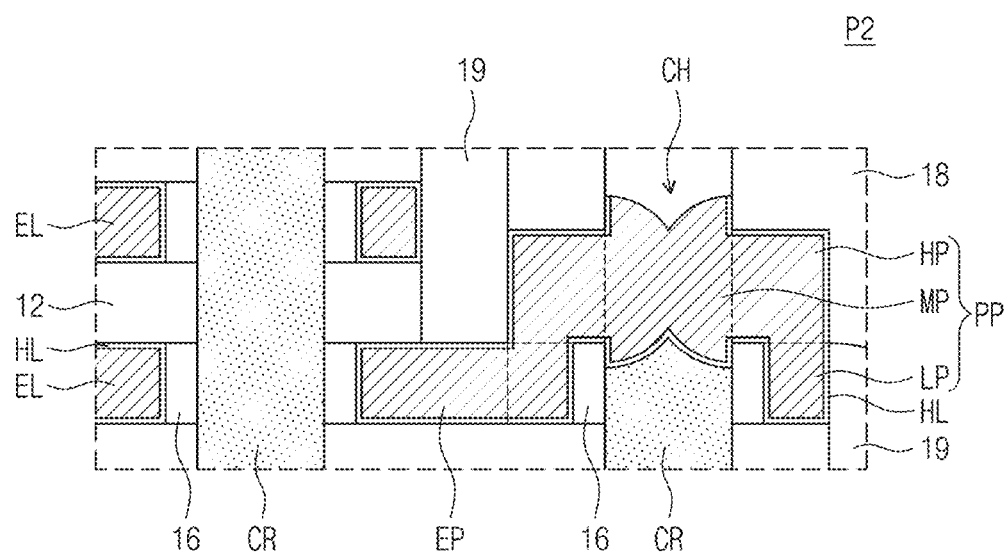

Referring to FIGS. 28 and 29, upper portions of the penetration holes CH may be re-opened by removing upper portions of the preliminary insulating pillars 81, which are separated from its lower portions by the pad portions PP. In an example embodiment, at least a portion of the horizontal insulating layer HL covering a top surface of the second portion MP may be removed during the removal of the upper portions of the preliminary insulating pillars 81. The lower portions of the preliminary insulating pillars 81, which are not removed during the process, may form the insulating pillars CR.

Figure 30:
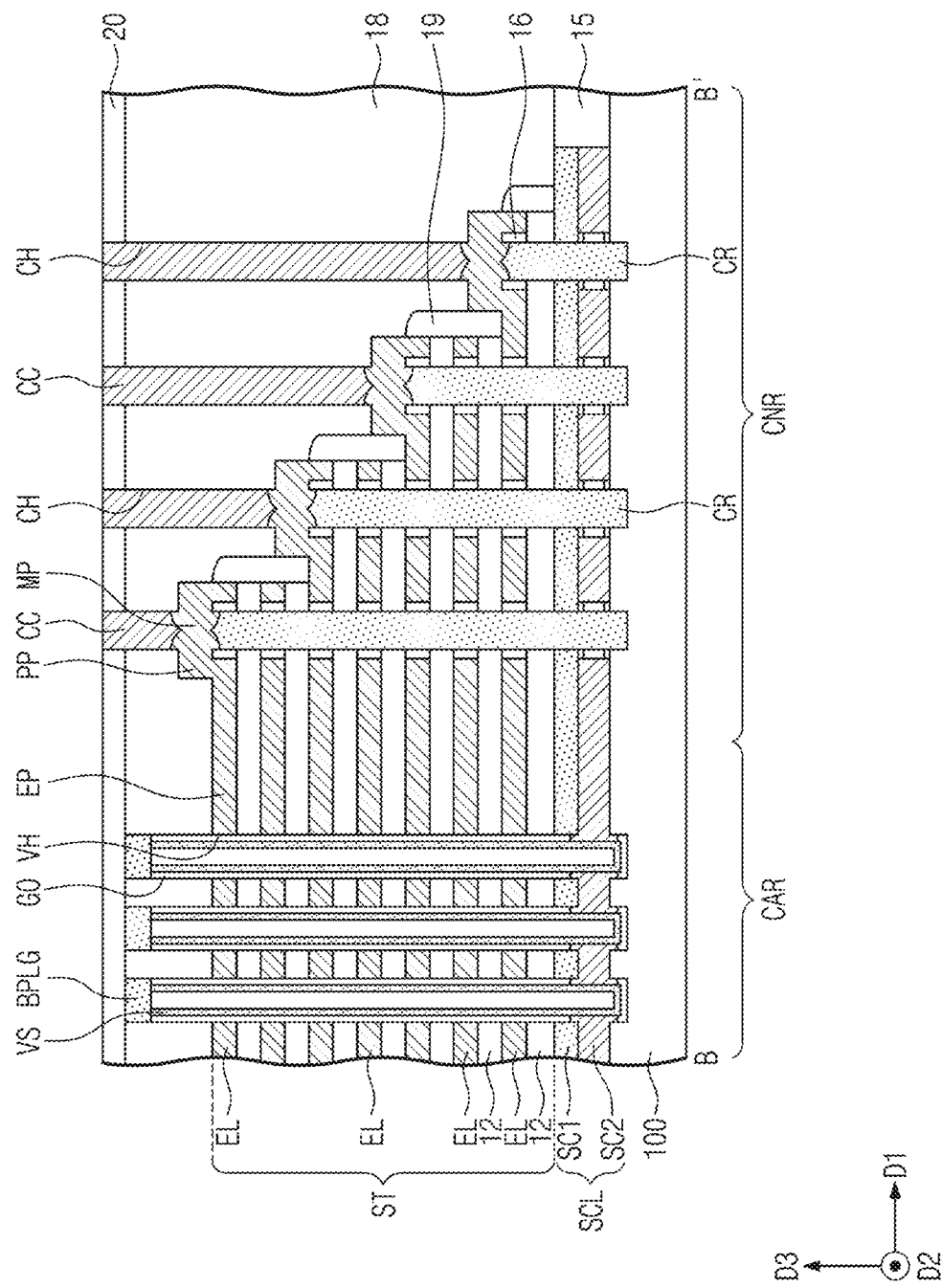

Referring to FIG. 30, the cell contacts CC may be formed on the pad portions PP, respectively, to fill the upper portions of the penetration holes CH. The cell contacts CC may be connected to the second portions MP of the pad portions PP. The cell contacts CC may be formed of or include at least one of metallic materials (e.g., tungsten, copper, and aluminum).

Figure 31:
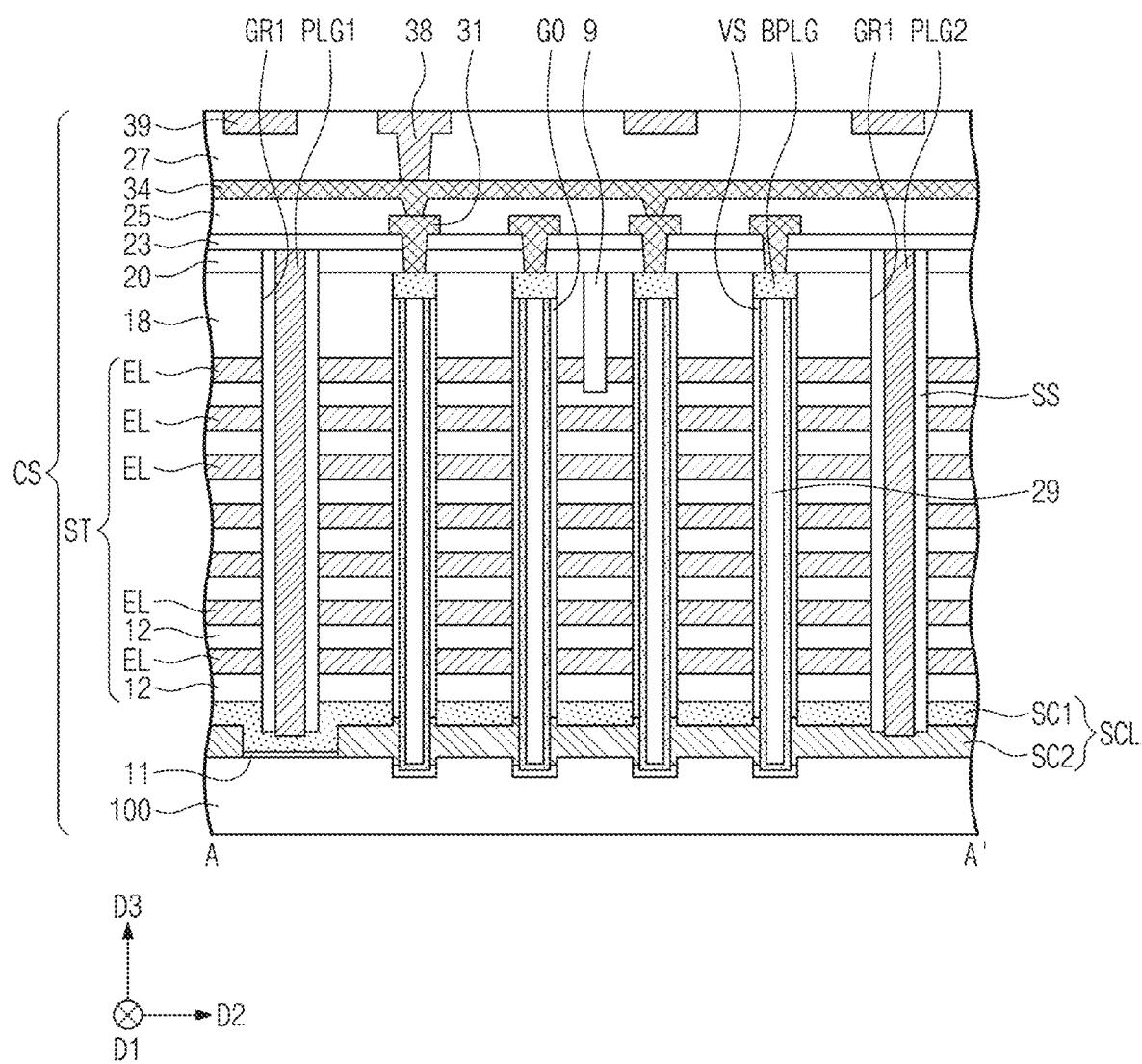
Figure 32:
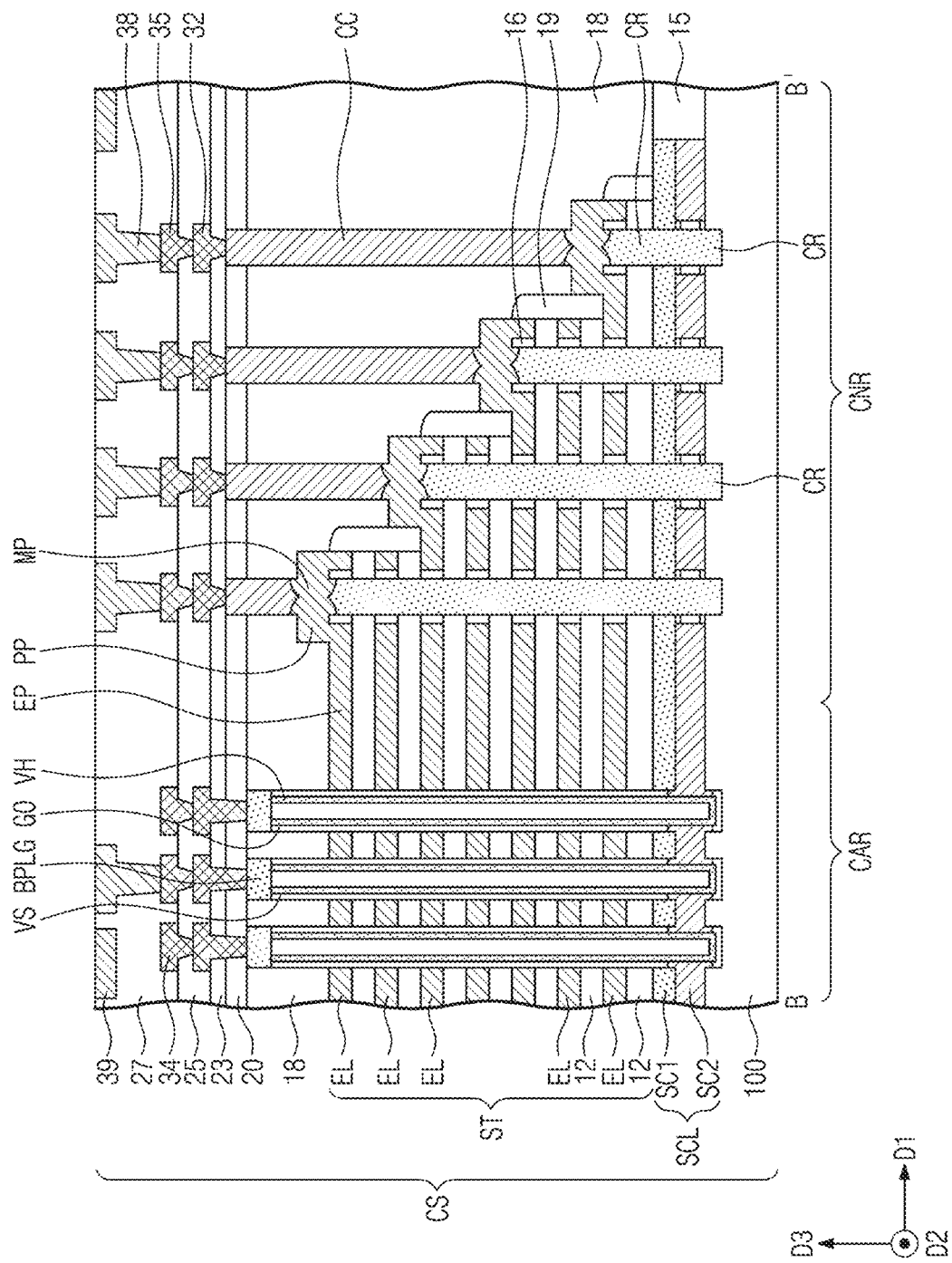

Referring to FIGS. 31 and 32, as the last step of the fabrication of the first chip CS, a plurality of metal interconnection layers may be formed on the first upper insulating layer 20. The second upper insulating layer 23 may be formed on the first upper insulating layer 20, and then, a first interconnection layer may be formed to penetrate the first upper insulating layer 20 and/or the second upper insulating layer 23. The first interconnection layer may include the first contacts 31, which are connected to the bit line pads BPLG, and the second contacts 32, which are connected to the cell contacts CC. The third upper insulating layer 25 may be formed on the first interconnection layer, and then, a second interconnection layer may be formed. The second interconnection layer may include the first interconnection lines 34, which penetrate the third upper insulating layer 25 and are connected to the first contacts 31, and the second interconnection lines 35, which are connected to the second contacts 32. Each of the first and second interconnection layers may include at least one of metallic materials (e.g., aluminum or tungsten).

The fourth upper insulating layer 27 may be formed on the third upper insulating layer 25, and then, the first bonding metal patterns 38 and 39, which are connected to the first and second interconnection lines 34 and 35, may be formed in the fourth upper insulating layer 27. The first bonding metal patterns 38 and 39 may be formed of or include copper (Cu).

Referring back to FIGS. 6 and 7, a bonding process may be performed to connect the first chip CS to the second chip PS. The second chip PS may be fabricated as a chip that is independent of the first chip CS. The second chip PS may include the second substrate 200, the peripheral circuits 215, the peripheral interlayer insulating layer 210, and peripheral circuit interconnection lines. The peripheral circuit interconnection lines may include the first interconnection layer 240, the second interconnection layer 230, and the second bonding metal patterns 220. The bonding process on the first and second chips CS and PS may include a process of bonding the first bonding metal patterns 38 and 39 to the second bonding metal patterns 220 using heat and pressure.

Figure 33:
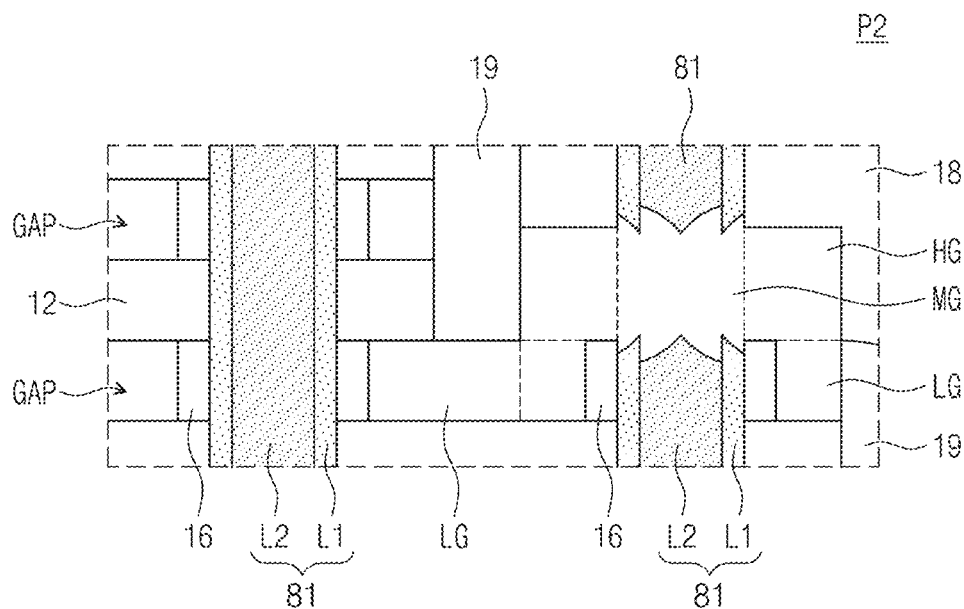
FIGS. 33 and 34 are sectional views illustrating a semiconductor device and a method of fabricating the same, according to an example embodiment of the inventive concepts.
Figure 34:
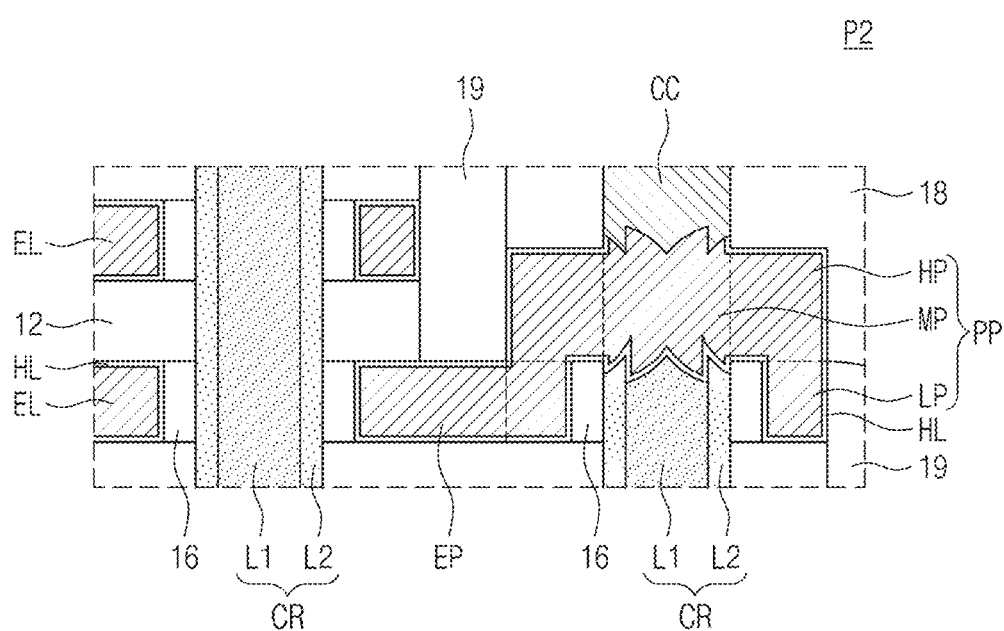

FIGS. 33 and 34 are sectional views illustrating a semiconductor device and a method of fabricating the same, according to an example embodiment of the inventive concepts. For concise description, a previously described element may be identified by the same reference number without repeating an overlapping description thereof.

FIG. 33 is an enlarged sectional view corresponding to a portion 'P2' of FIG. 23. In the present example embodiment, the preliminary insulating pillar 81 may include a plurality of layers, which have different etch rates from each other in the isotropic etching process for forming the second recess regions MG. As an example, the preliminary insulating pillar 81 may include a second layer L2 having a relatively high etch rate and a first layer L1 having a relatively low etch rate and covering a side surface of the second layer L2. A difference in etch rate between the first and second layers L1 and L2 may result from a difference in material or density between them. As an example, the second layer L2 may have a higher nitrogen concentration than the first layer L1.

The first and second layers L1 and L2 may be sequentially etched through a plurality of etching processes. Due to the difference in etch rates between the first and second layers L1 and L2, the second recess regions MG may be formed to have a shape different from that in FIG. 24. As an example, the second recess regions MG may have a discontinuous shape at an interface between the first and second layers L1 and L2. As an example, the second recess regions MG may be extended in the third direction D3 and in an opposite direction of the third direction D3, at the interface between the first and second layers L1 and L2.

Thereafter, the processes described with reference to FIGS. 25 to 32 may be performed to form the pad portions PP shown in FIG. 34.

Figure 35:
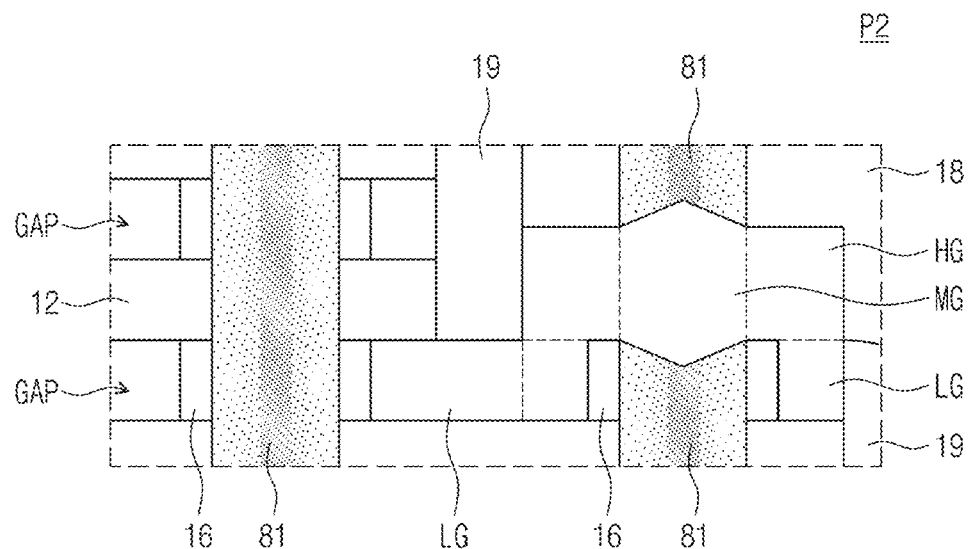
FIGS. 35 and 36 are sectional views illustrating a semiconductor device and a method of fabricating the same, according to an example embodiment of the inventive concepts.
Figure 36:
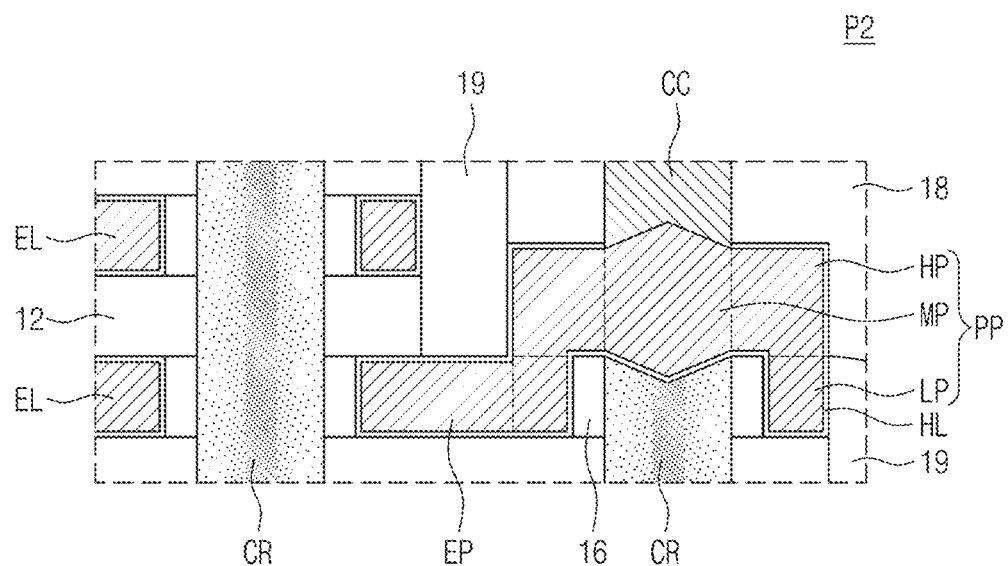
Figure 37:
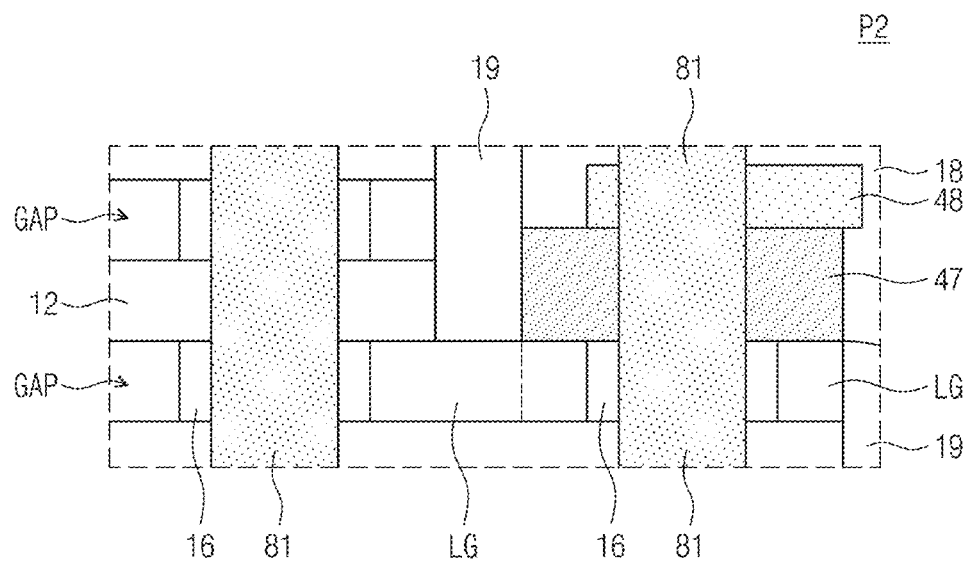
FIGS. 37 to 42 are sectional views illustrating a semiconductor device and a method of fabricating the same, according to an example embodiment of the inventive concepts.

FIGS. 35 and 36 are sectional views illustrating a semiconductor device and a method of fabricating the same, according to an example embodiment of the inventive concepts. For concise description, a previously described element may be identified by the same reference number without repeating an overlapping description thereof.

FIG. 35 is an enlarged sectional view corresponding to the portion 'P2' of FIG. 23. In the present example embodiment, the preliminary insulating pillar 81 may include a plurality of regions, which have different etch rates from each other in the isotropic etching process for forming the second recess regions MG. As an example, an etch resistant property of the preliminary insulating pillar 81 may be higher in its outer portion than in its center portion. As an example, in the preliminary insulating pillar 81, a nitrogen concentration of the outer portion may be higher than that in the center portion. Accordingly, the second recess regions MG may be formed to have a shape whose length in the third direction D3 increases in a direction toward a center axis of the preliminary insulating pillar 81 in the first direction D1.

Thereafter, the processes described with reference to FIGS. 25 to 32 may be performed to form the pad portions PP shown in FIG. 36.

FIGS. 37 to 42 are sectional views illustrating a semiconductor device and a method of fabricating the same, according to an example embodiment of the inventive concepts. For concise description, a previously described element may be identified by the same reference number without repeating an overlapping description thereof.

In the process described with reference to FIGS. 11 and 12, a portion of the mask layer 46 may not be removed and may be left on the pad sacrificial pattern 47. The unremoved portion of the mask layer 46 may be referred to as a remaining mask pattern 48. Thereafter, the processes described with reference to FIGS. 13 to 19 may be further performed to form the structure of FIG. 37.

Figure 38:
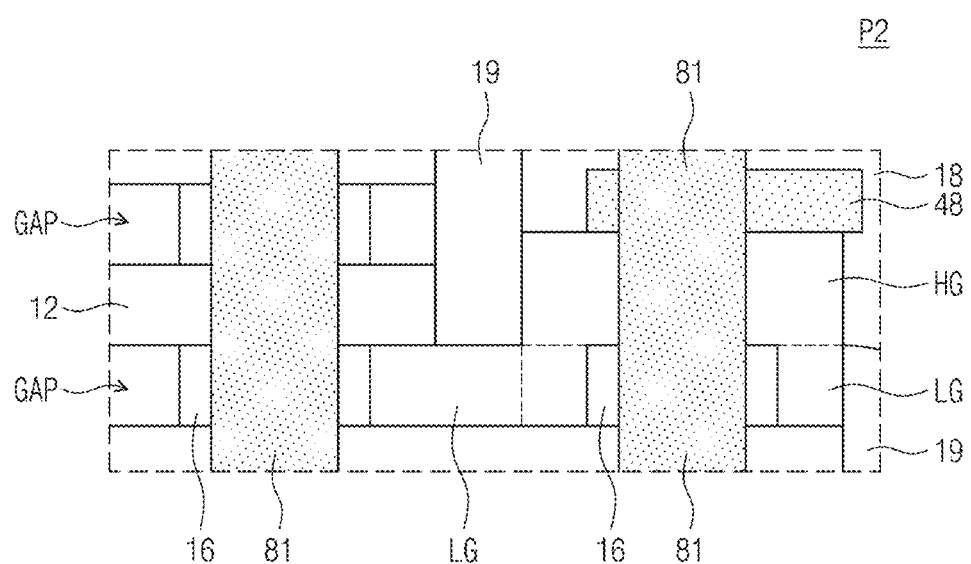

Referring to FIG. 38, the process described with reference to FIG. 22 may be performed to form the first recess regions HG, which are extended from the gap regions GAP. The remaining mask pattern 48 may not be removed to define top surfaces of the first recess regions HG.

Figure 39:
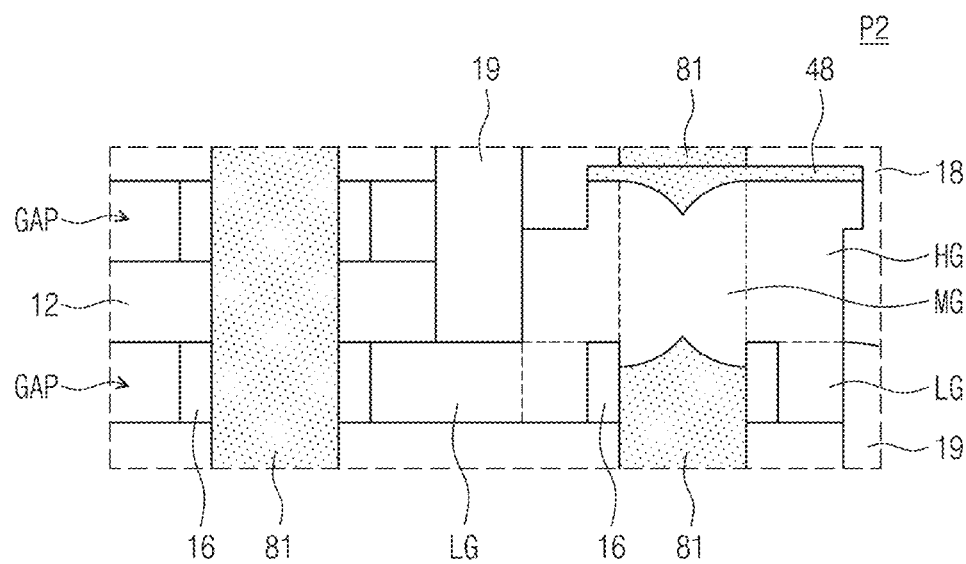

Referring to FIG. 39, an isotropic etching process on the preliminary insulating pillars 81 may be performed to form the second recess regions MG, which extends from the gap regions GAP. At least a portion of the remaining mask pattern 48 may also be removed when the preliminary insulating pillars 81 are etched. A portion of the remaining mask pattern 48 may not be removed and may define a top surface of the second recess region MG.

Figure 40:
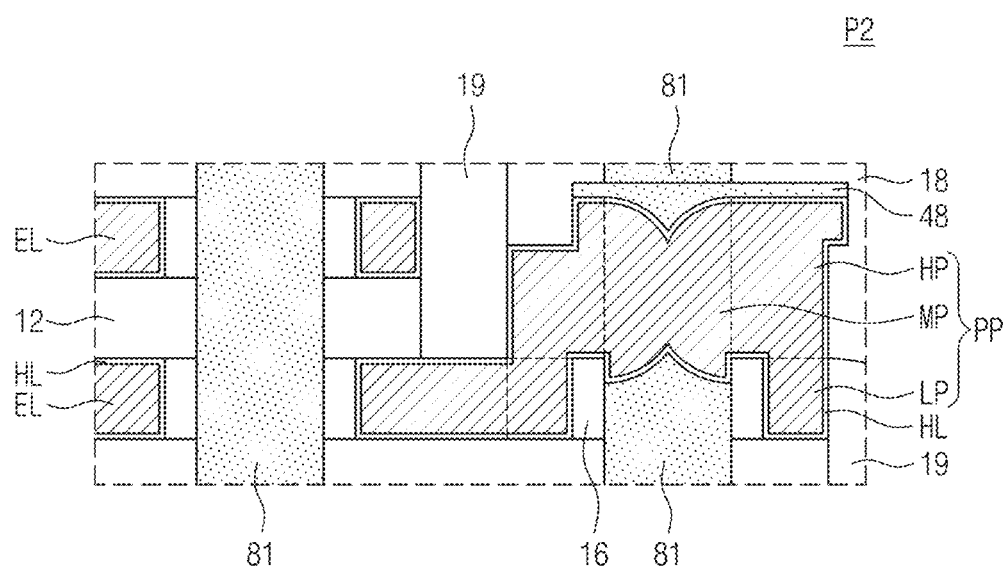

Referring to FIG. 40, the horizontal insulating layer HL and the electrodes EL may be formed to sequentially fill the gap regions GAP. The horizontal insulating layer HL may be in contact with a bottom surface of the remaining mask pattern 48.

Figure 41:
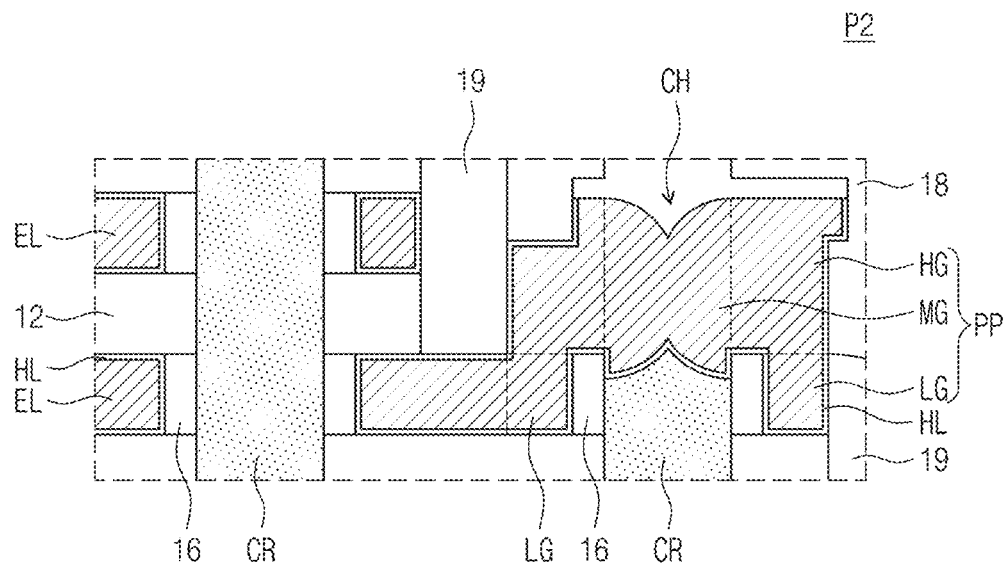

Referring to FIG. 41, upper portions of the penetration holes CH may be re-opened by removing upper portions of the preliminary insulating pillars 81, which are separated from its lower portions by the pad portions PP. The remaining mask pattern 48 may also be removed when the upper portions of the preliminary insulating pillars 81 are removed. Accordingly, a lower portion of the penetration hole CH may be horizontally extended. In addition, at least a portion of the horizontal insulating layer HL covering the top surface of the second portion MP may also be removed when the remaining mask pattern 48 is removed.

Figure 42:
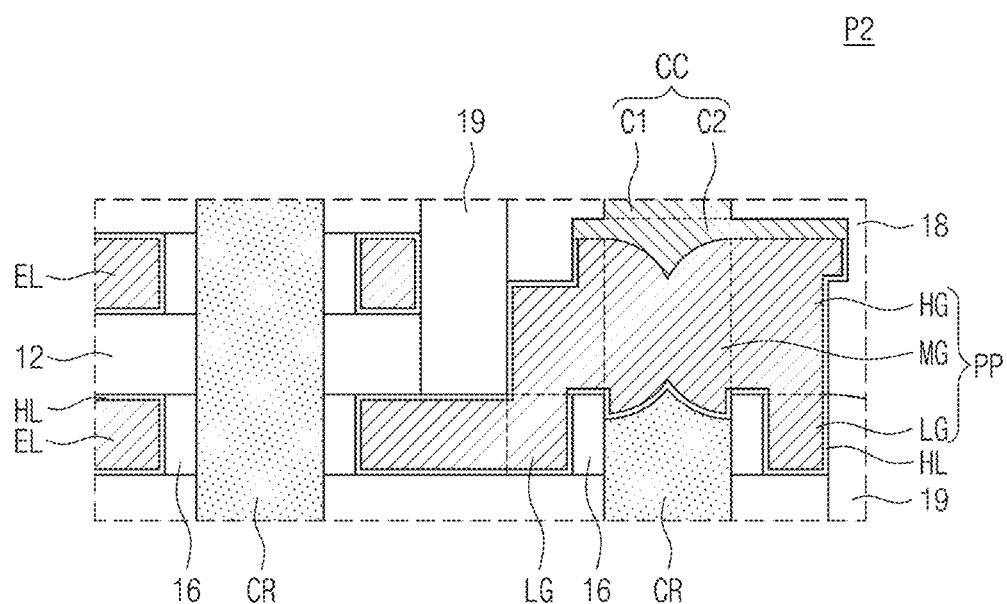

Referring to FIG. 42, the cell contacts CC may be formed on the pad portions PP, respectively, to fill the penetration holes CH. At least a portion of the cell contacts CC may include a lower portion C2, which is formed to occupy the space formed by removing the remaining mask pattern 48, and an upper portion C1, which is formed on the lower portion C2. A width of the lower portion C2 in the second direction D2 may be larger than a width of the upper portion C1.

Any functional blocks shown in the figures and described above may be implemented in processing circuitry such as hardware including logic circuits; a hardware/software combination such as a processor executing software; or a combination thereof. For example, the processing circuitry more specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc.

In a semiconductor device according to an example embodiment of the inventive concepts, it may be possible to mitigate or prevent a distance between electrodes or a distance between a cell contact and an electrode adjacent thereto from being abnormally reduced and thereby to suppress interference and breakdown-voltage drop between the electrodes. Thus, it may be possible to mitigate or prevent malfunction of the semiconductor device and to improve reliability of the semiconductor device.

While some example embodiments of the inventive concepts have been particularly shown and described, it will be understood by one of ordinary skill in the art that variations in form and detail may be made therein without departing from the spirit and scope of the attached claims.

What is claimed is:

1. A semiconductor device, comprising:
   a substrate including a cell array region and a connection region;
   an electrode structure including electrodes stacked on the substrate, each of the electrodes including a line portion on the cell array region and a pad portion on the connection region;
   vertical patterns penetrating the electrode structure;
   a cell contact on the connection region and connected to the pad portion; and
   an insulating pillar below the cell contact, with the pad portion interposed therebetween,
   wherein the pad portion comprises,
      a first portion having a top surface higher than the line portion, and
      a second portion being between the cell contact and the insulating pillar, the second portion including a first protruding portion, the first protruding portion extending from the first portion toward the substrate and covering a top surface of the insulating pillar, and
   wherein a thickness of the second portion is larger than a thickness of the first portion.

2. The semiconductor device of claim 1, further comprising:
   a contact insulating pattern on a side surface of the insulating pillar,
   wherein the first protruding portion covers an inner side surface of the contact insulating pattern.

3. The semiconductor device of claim 2, wherein a bottom surface of the first portion covers a top surface of the contact insulating pattern.

4. The semiconductor device of claim 2, wherein
   the pad portion further comprises a third portion, the third portion connected to the line portion and being below the first portion, and
   the third portion covers an outer side surface of the contact insulating pattern.

5. The semiconductor device of claim 1, wherein the electrode structure further comprises:
   interlayer insulating layers between the electrodes; and
   a horizontal insulating layer between the electrodes and the interlayer insulating layers,
   wherein the horizontal insulating layer extends into a region between the insulating pillar and the first protruding portion of the second portion.

6. The semiconductor device of claim 1, wherein the second portion further comprises a second protruding portion, which extends in a direction away from the substrate and is connected to the cell contact.

7. The semiconductor device of claim 6, wherein the electrode structure further comprises:
   interlayer insulating layers between the electrodes; and
   a horizontal insulating layer between the electrodes and the interlayer insulating layers,
   wherein the second protruding portion of the second portion penetrates the horizontal insulating layer and is connected to the cell contact.

8. The semiconductor device of claim 1, wherein the top surface of the insulating pillar is higher than a bottom surface of the line portion to which a corresponding one of the electrodes is connected.

9. The semiconductor device of claim 8, wherein
   the first protruding portion comprises a recess region, and
   the insulating pillar fills the recess region.

10. The semiconductor device of claim 8, further comprising:
    a contact insulating pattern on a side surface of the insulating pillar,
    wherein the contact insulating pattern comprises a plurality of contact insulating patterns along the side surface of the insulating pillar, and
    the insulating pillar penetrates at least one of the electrodes and is spaced apart from the at least one of the electrodes by the contact insulating pattern.

11. The semiconductor device of claim 1, wherein
    the semiconductor device comprises a first chip including the substrate and the electrode structure, and a second chip connected to the first chip and including a peripheral circuit region, and
    the electrode structure and the cell contact are between the substrate of the first chip and the second chip.

12. The semiconductor device of claim 11, wherein the first chip further comprises a first bonding metal layer, the second chip further comprises a second bonding metal layer, and the first bonding metal layer and the second bonding metal layer are in direct contact with each other, at an interface between the first chip and the second chip.

13. A semiconductor device, comprising:

a substrate including a cell array region and a connection region;

an electrode structure including electrodes stacked on the substrate, each of the electrodes including a line portion on the cell array region and a pad portion on the connection region;

vertical patterns penetrating the electrode structure;

a cell contact on the connection region and connected to the pad portion; and an insulating pillar below the cell contact, with the pad portion interposed therebetween, wherein the pad portion comprises, a first portion having a top surface higher than the line portion, and a second portion being between the cell contact and the insulating pillar, the second portion including a first protruding portion, the first protruding portion extending from the first portion toward the substrate and covering a top surface of the insulating pillar, and wherein the insulating pillar is connected to the substrate.

14. A semiconductor device, comprising:

a first chip including a substrate, the substrate including a cell array region and a connection region; and a second chip including a peripheral circuit region and a second bonding metal layer, wherein the first chip comprises, an electrode structure between the substrate and the second chip, the electrode structure comprising electrodes stacked on the substrate, each the electrodes including a line portion on the cell array region and a pad portion on the connection region;

vertical patterns penetrating the electrode structure;

a cell contact on the connection region and connected to the pad portion;

an insulating pillar below the cell contact, with the pad portion interposed therebetween;

a contact insulating pattern on a side surface of the insulating pillar; and a first bonding metal layer on the cell contact, wherein the pad portion comprises, a first portion on a second portion and having a top surface higher than the line portion, the second portion between the cell contact and the insulating pillar, and a third portion connected to the line portion, and wherein the first bonding metal layer and the second bonding metal layer are in direct contact with each other, at an interface between the first chip and the second chip.

15. The semiconductor device of claim 14, wherein a thickness of the second portion is larger than a thickness of the first portion.

16. The semiconductor device of claim 14, wherein the second portion comprises:

a first protruding portion extending from the first portion toward the substrate and covering a top surface of the insulating pillar; and a second protruding portion extending in a direction away from the substrate and connecting to the cell contact.

17. The semiconductor device of claim 16, wherein the electrode structure further comprises:

interlayer insulating layers between the electrodes; and a horizontal insulating layer between the electrodes and the interlayer insulating layers, wherein the horizontal insulating layer extends into a region between the insulating pillar and the first protruding portion of the second portion.

18. The semiconductor device of claim 16, wherein the first protruding portion covers an inner side surface of the contact insulating pattern.

\* \* \* \* \*